(12) United States Patent
Ibata et al.

(10) Patent No.: US 11,248,086 B2
(45) Date of Patent: Feb. 15, 2022

(54) HARD-MASK FORMING COMPOSITION AND METHOD FOR MANUFACTURING ELECTRONIC COMPONENT

(71) Applicant: TOKYO OHKA KOGYO CO., LTD., Kawasaki (JP)

(72) Inventors: Keiichi Ibata, Kawasaki (JP); Ryoji Watanabe, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 289 days.

(21) Appl. No.: 16/387,164

(22) Filed: Apr. 17, 2019

(65) Prior Publication Data

US 2019/0341253 A1 Nov. 7, 2019

(30) Foreign Application Priority Data

May 1, 2018 (JP) .............................. JP2018-088421

(51) Int. Cl.
| | | |
|---|---|---|
| C08G 61/12 | (2006.01) | |
| G03F 7/004 | (2006.01) | |
| C08L 61/06 | (2006.01) | |
| C08G 8/04 | (2006.01) | |
| C08G 16/02 | (2006.01) | |
| C08L 61/34 | (2006.01) | |
| G03F 7/075 | (2006.01) | |
| G03F 7/09 | (2006.01) | |
| H01L 21/02 | (2006.01) | |
| H01L 21/033 | (2006.01) | |

(52) U.S. Cl.
CPC ............ *C08G 61/124* (2013.01); *C08G 8/04* (2013.01); *C08G 16/0268* (2013.01); *C08L 61/06* (2013.01); *C08L 61/34* (2013.01); *G03F 7/0041* (2013.01); *G03F 7/0752* (2013.01); *G03F 7/094* (2013.01); *H01L 21/02118* (2013.01); *H01L 21/02282* (2013.01); *H01L 21/0332* (2013.01); *C08L 2205/02* (2013.01)

(58) Field of Classification Search
CPC ... C08G 8/00; C08G 8/02; C08G 8/04; C08G 8/06; C08G 8/08; C08G 8/10; C08G 8/12; C08G 8/14; C08G 8/16; C08G 8/18; C08G 8/20; C08G 8/22; C08G 8/24; C08G 8/26; C08G 16/0256; C08G 16/0262; C08G 16/0275; C08G 16/0281; C08G 16/0287; C08G 16/0293; C08L 61/00; C08L 61/02; C08L 61/04; C08L 61/06; C08L 61/12; C08L 61/14; C08L 61/16; C08L 61/18; C08L 61/20; C08L 61/22; C08L 61/24; C08L 61/26; C08L 61/28; C08L 61/30; C08L 61/32; C08L 61/34; C08L 2205/02; C08L 2205/025; G03F 7/008; G03F 7/0085; G03F 7/012; G03F 7/0125; G03F 7/04; G03F 7/06; G03F 7/63; G03F 7/066; G03F 7/085; G03F 7/094

See application file for complete search history.

(56) References Cited

U.S. PATENT DOCUMENTS

2012/0077345 A1 * 3/2012 Saito ....................... G03F 7/094
                                                       438/703

FOREIGN PATENT DOCUMENTS

| JP | 61-239243 A | 10/1986 |
|---|---|---|
| JP | 62-025744 A | 2/1987 |
| JP | 2001-051422 A | 2/2001 |
| JP | 2015-091775 A | 5/2015 |
| KR | 20080107208 A * | 12/2008 |

OTHER PUBLICATIONS

KR20080107208 English Machine Translation, prepared Jun. 29, 2021. (Year: 2021).*

* cited by examiner

*Primary Examiner* — Christopher M Rodd
(74) *Attorney, Agent, or Firm* — Knobbe Martens Olson & Bear LLP

(57) ABSTRACT

A hard-mask forming composition, which is used for forming a hard mask used in lithography, including a first resin and a second resin, in which an amount of carbon contained in the first resin is 85% by mass or more with respect to the total mass of all elements constituting the first resin, and the amount of carbon contained in the second resin is 70% by mass or more with respect to the total mass of all elements constituting the second resin and less than the amount of carbon contained in the first resin.

6 Claims, 4 Drawing Sheets

HARD-MASK FORMING COMPOSITION AND METHOD FOR MANUFACTURING ELECTRONIC COMPONENT

BACKGROUND OF THE INVENTION

Field of the Invention

The present invention relates to a hard-mask forming composition and a method for manufacturing an electronic component.

Priority is claimed on Japanese Patent Application No. 2018-088421, filed on May 1, 2018, the content of which is incorporated herein by reference.

Description of Related Art

Generally, in semiconductor manufacturing, a laminate in which a resist film is formed on a substrate, such as a silicon wafer, is subjected to processing including dry etching, for example, a treatment in which dry etching is carried out with the resist film which is selectively exposed to form a resist pattern thereon as a mask, thereby forming a pattern on the substrate.

As a pattern forming method using a resist film, a three-layer resist method is known (for example, see Japanese Unexamined Patent Application First Publication No. 2001-051422). The three-layer resist method is that an organic hard mask layer is formed using an organic material on a support, an inorganic hard mask layer is formed using an inorganic material on the organic hard mask layer; a resist film is further formed on the inorganic hard mask layer; a resist pattern is formed by typical lithography; an inorganic hard mask pattern is formed by etching the inorganic hard mask layer with the resist pattern as a mask; an organic hard mask pattern is formed by etching the organic hard mask layer with the inorganic hard mask pattern as a mask; and the support is processed by being etched with the organic hard mask pattern as a mask.

Additionally, a two-layer resist method with fewer steps than the three-layer resist method has also been proposed (for example, see Japanese Unexamined Patent Application First Publication Nos. S61-239243 and S62-025744). The two-layer resist method is that the organic hard mask layer is provided on the support in the same manner as in the three-layer resist method; the resist film is provided on the organic hard mask layer; the resist pattern is formed by typical lithography; the organic hard mask pattern is formed by etching the organic hard mask layer with the resist pattern as a mask; and the support is processed by being etched with the organic hard mask pattern as a mask.

As a method of forming the organic hard mask layer, a chemical vapor deposition method (hereinafter, sometimes referred to as a "CVD method)" is generally known. The CVD method uses amorphous carbon as a hard-mask forming material and has problems including slow throughput and expensive equipment investment.

Therefore, film formation by spin-on-coating has been introduced in recent years (for example, see Japanese Unexamined Patent Application First Publication No. 2015-091775), for which organic hard-mask forming materials applicable to such a film formation have been proposed. The spin-on-coating has advantageous effects of high throughput and usability of the existing spin coater as compared with the CVD method.

SUMMARY OF THE INVENTION

An organic hard-mask forming material is required to be a material having high etching resistance in order to serve as a mask for substrate processing. Heat resistance is also required since such a material is necessary to be tolerate to the high temperature upon forming an inorganic hard mask layer.

Meanwhile, in a case of performing deep processing on a substrate, an organic hard mask layer also needs to have a thickness sufficient for deep processing. Therefore, the organic hard-mask forming material is required to be a material capable of thickening the organic hard mask layer. However, in a case of an organic material having high etching resistance and heat resistance, cracks may occur as the thickness increases, and thus the thick film formation may be hindered. Consequently, it is demanded to develop organic hard mask forming materials which have high etching resistance and heat resistance, and are suitable for thick film formation.

The present invention is made to provide a hard-mask forming composition having high etching resistance and heat resistance, which is suitable for thickening, and a method for manufacturing an electronic component using the hard-mask forming composition with consideration of such problems.

The present invention employs the following configurations in order to solve the above-described problems.

That is, a first aspect of the present invention provides a hard-mask forming composition, used for forming a hard mask used in lithography, which includes a first resin and a second resin, in which an amount of carbon contained in the first resin is 85% by mass or more with respect to the total mass of all elements constituting the first resin, and an amount of carbon contained in the second resin is 70% by mass or more with respect to the total mass of all elements constituting the second resin and less than the amount of carbon contained in the first resin.

A second aspect of the present invention provides a method for manufacturing an electronic component, which includes: forming a hard mask layer (m1) is on a support using the hard-mask forming composition according to the first aspect; forming a hard mask layer (m2) made of an inorganic material on the hard mask layer (m1); forming a resist film on the hard mask layer (m2); forming a resist pattern on the hard mask layer (m2) by exposing and developing the resist film; etching the hard mask layer (m2) with the resist pattern as a mask to form an inorganic pattern; etching the hard mask layer (m1) with the inorganic pattern as a mask to form a resin pattern; and processing the support with the resin pattern as a mask.

A third aspect of the present invention provides a method for manufacturing an electronic component, which includes: forming a hard mask layer (m1) is on a support using the hard-mask forming composition according to the first aspect; forming an inorganic pattern made of an inorganic material on the hard mask layer (m1); etching the hard mask layer (m1) with the inorganic pattern as a mask to form a resin pattern; and processing the support with the resin pattern as a mask.

According to the present invention, it is possible to provide a hard-mask forming composition having high etching resistance and heat resistance, which is suitable for thickening, and a method for manufacturing an electronic component using the hard-mask forming composition.

DETAILED DESCRIPTION OF THE INVENTION

Figure 1:
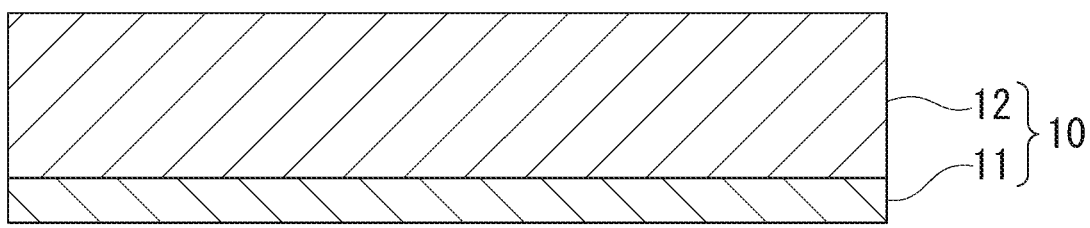
FIG. 1 is a view showing an exemplary example of a support used in a method for manufacturing an electronic component according to an embodiment of the present invention.

In the detailed description and claims of the present invention, the term "aliphatic" is a relative concept to "aromatic", and is defined to mean a group, a compound or the like, which has no aromaticity.

The term "alkyl group" is intended to encompass linear, branched and cyclic monovalent saturated hydrocarbon groups, unless otherwise specified. The same definition applies to an alkyl group in an alkoxy group.

The term "alkylene group" is intended to encompass linear, branched and cyclic divalent saturated hydrocarbon groups, unless otherwise specified.

The term "halogenated alkyl group" referrer to a group in which part or all of the hydrogen atoms of the alkyl group are substituted with halogen atoms, and the halogen atom includes a fluorine atom, a chlorine atom, a bromine atom and an iodine atom.

The term "fluorinated alkyl group" or "fluorinated alkylene group" refers to a group in which a part or all of the hydrogen atoms of an alkyl group or an alkylene group are substituted with fluorine atoms.

The term "structural unit" refers to a monomer unit (monomer unit) constituting a polymer compound (resin, polymer or copolymer).

The expression "may have a substituent" includes both cases where a hydrogen atom (—H) is substituted by a monovalent group, and where a methylene group (—CH$_2$—) is substituted by a divalent group.

The term "exposure" is a concept that includes general radiation irradiations.

In the present specification and the scope of the present patent claims, asymmetric carbons may be present or enantiomers or diastereomers may be present depending on the structures of the chemical formulae. Those isomers are collectively represented by one formula. One isomer or a combination of isomers may be used.

Hard-Mask Forming Composition

The hard-mask forming composition according to the first aspect of the present invention is a composition for forming a hard mask used in lithography. The hard-mask forming composition of the embodiment includes a first resin and a second resin, in which an amount of carbon contained in the first resin is 85% by mass or more a with respect to the total mass of all elements constituting the first resin, and an amount of carbon contained in the second resin is 70% by mass or more with respect to the total mass of all elements constituting the second resin and less than the amount of carbon contained in the first resin.

First Resin

The first resin is characterized in that the amount of carbon contained in the resin is 85% by mass or more with respect to the total mass of all elements constituting the first resin. By using the first resin having a high carbon content, the hard-mask forming composition having high etching resistance and heat resistance can be prepared.

The carbon amount (% by mass) of the resin with respect to the total mass of all elements constituting the resin is determined as the sum of values calculated by multiplying the carbon amount (% by mass) of each structural unit by the molar ratio of the structural unit. More specifically, the carbon amount (% by mass) in the resin (R), which is a copolymer of the structural unit (uA) and the structural unit (uB), can be determined by the following equation (1). The carbon amount (% by mass) of a resin which has 3 or more types of structural units can be similarly calculated.

$$\text{Carbon amount of resin (\% by mass)} = C^{uA}/T^{uA} \times a + C^{uB}/T^{uB} \times b \qquad (1)$$

$Cu^{uA}$: molar mass of carbon atoms contained in the structural unit (uA)

$T^{uA}$: molar mass of the structural unit (uA)

$C^{uB}$: molar mass of carbon atoms contained in the structural unit (uB)

$T^{uB}$: molar mass of the structural unit (uB)

a: molar ratio (%) of the structural unit (uA) in the resin (R)

b: molar ratio (%) of the structural unit (uB) in the resin (R)

The carbon amount in the first resin is not particularly limited as long as it is 85% by mass or more, but preferably 87% by mass or more, more preferably 88% by mass or more, still more preferably 89% by mass or more, particularly preferably 90% by mass or more. The carbon amount of the first resin is, for example, in a range of 85 to 96% by mass, preferably in a range of 87 to 95% by mass, more preferably in a range of 88 to 94% by mass, still more preferably in a range of 89 to 93% by mass, particularly preferably in a range of 90 to 92% by mass. By setting the carbon amount of the first resin to be greater than or equal to the lower limit value of the range described above, it is possible to form a hard mask having high etching resistance and high heat resistance. Further, by setting the carbon amount of the first resin to be equal to or less than the upper limit value of the range described above, carbon and other elements can be balanced.

Examples of the structural unit contained in the first resin include a structural unit (u11) represented by the following general formula (u11-1), a structural unit (u12) represented by the following general formula (u12-1), and a structural unit (u13) represented by the following general formula (u13-1).

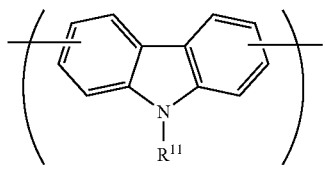

(u11-1)

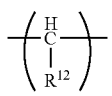

(u12-1)

In the formula, $R^{11}$ is a hydrocarbon group having 1 to 20 carbon atoms which may have a substituent, or a hydrogen atom, and $R^{12}$ is an aromatic hydrocarbon group having 6 to 30 carbon atoms which may have a substituent.

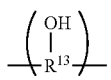

(u13-1)

In the formula, $R^{13}$ is a polycyclic hydrocarbon group of 10 to 30 carbon atoms which may have a substituent.

Structural Unit (u11)

The structural unit (u11) is a structural unit represented by the general formula (u11-1). In the general formula (u11-1), $R^{11}$ represents a hydrocarbon group having 1 to 20 carbon atoms which may have a substituent, or a hydrogen atom. The carbon atoms contained in the substituent are not counted for the carbon number. Hereinafter, the carbon atoms contained in the substituent are not counted for the carbon number, unless otherwise specified.

The hydrocarbon group for $R^{11}$ may be an aliphatic hydrocarbon group or an aromatic hydrocarbon group.

The aliphatic hydrocarbon group may be a saturated aliphatic hydrocarbon group or an unsaturated aliphatic hydrocarbon group. In particular, examples of the aliphatic hydrocarbon group include linear or branched aliphatic hydrocarbon groups, aliphatic hydrocarbon groups containing a ring in a structure, and the like.

The linear aliphatic hydrocarbon group has preferably 1 to 10 carbon atoms, more preferably 1 to 5 carbon atoms, still more preferably 1 to 3 carbon atoms. The branched aliphatic hydrocarbon group has preferably 3 to 10 carbon atoms, more preferably 3 to 5 carbon atoms.

Specific examples of linear or branched aliphatic hydrocarbon groups include a linear alkyl group such as methyl, ethyl, n-propyl, n-butyl, n-pentyl or the like; a branched alkyl group such as isopropyl group, isobutyl group, tert-butyl group, isopentyl group, neopentyl group, 1,1-diethylpropyl group, 2,2-dimethylbutyl group or the like; a linear alkenyl group such as vinyl group, propenyl group (allyl group), 2-butenyl group or the like; a branched alkenyl group such as 1-methylvinyl group, 2-methylvinyl group, 1-methylpropenyl group, 2-methylpropenyl group or the like; a linear alkynyl group such as ethynyl group, propargyl group, 3-pentynyl group or the like; a branched alkynyl such as 1-methylpropargyl group or the like; and the like.

The linear or branched aliphatic hydrocarbon group for RH may or may not have a substituent. Examples of the substituent include a hydroxy group, a carbonyl group, an alkoxy group, a halogen atom and the like.

Examples of the aliphatic hydrocarbon group containing a ring in the structure for $R^{11}$, an alicyclic hydrocarbon group (a group obtained by removing one hydrogen atom from an aliphatic hydrocarbon ring), a group in which one of hydrogen atoms of the aliphatic hydrocarbon ring is substituted by an alkylene group, and the like. The carbon number of the alkylene group is preferably 1 to 4. The aliphatic hydrocarbon ring has preferably 3 to 10 carbon atoms, more preferably 3 to 6 carbon atoms.

The aliphatic hydrocarbon ring may be a polycyclic ring or a monocyclic ring.

The monocyclic aliphatic hydrocarbon ring is preferably a ring having 3 to 6 carbon atoms. Specific examples thereof include cyclopropane, cyclobutane, cyclopentane, cyclohexane and the like.

The polycyclic aliphatic hydrocarbon ring is preferably a ring having a carbon number of 7 to 10. Specific examples thereof include polycycloalkanes having a bridged ring system polycyclic skeleton such as adamantane, norbornane and isobornane.

The cyclic aliphatic hydrocarbon group for RH may or may not have a substituent. Examples of the substituent include a hydroxy group, a carbonyl group, an alkoxy group, a halogen atom, an alkyl group, an alkenyl group, alkynyl group and the like. The alkyl group, the alkenyl group and the alkynyl group as the substituent have preferably 1 to 5 carbon atoms, more preferably 1 to 3 carbon atoms.

In a case where the hydrocarbon group for $R^{11}$ is an aromatic hydrocarbon group, the aromatic hydrocarbon group is a hydrocarbon group having at least one aromatic ring. The aromatic ring is not particularly limited as long as it is a cyclic conjugated system having $4n+2\pi$ electrons, and may be monocyclic or polycyclic. The carbon number of the aromatic ring is preferably 5 to 20, more preferably 5 to 18, still more preferably 6 to 16.

Specific examples of the aromatic ring include an aromatic hydrocarbon ring such as benzene, naphthalene, anthracene, phenanthrene, pyrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring and the like.

Specific examples of the aromatic hydrocarbon group for $R^{11}$ include a group (an aryl group or a heteroaryl group) obtained by removing one hydrogen atom from the aromatic hydrocarbon ring or aromatic heterocyclic ring; a group obtained by removing one hydrogen atom from an aromatic compound (for example, biphenyl, fluorene, and the like) containing two or more aromatic rings; a group (for example, an arylalkyl group such as benzyl, phenethyl, 1-naphthylmethyl, 2-naphthylmethyl, 1-naphthylethyl, 2-naphthylethyl and the like) in which one of the hydrogen atoms of the aromatic hydrocarbon ring or the aromatic heterocyclic ring is substituted with an alkylene group; and the like. The carbon number of the alkylene group bonded to the aromatic hydrocarbon ring or the aromatic heterocyclic ring is preferably 1 to 4, more preferably 1 to 2, particularly preferably 1.

The aromatic hydrocarbon group for $R^{11}$ may or may not have a substituent. Examples of the substituent include a hydroxy group, a carbonyl group, an alkoxy group, a halogen atom, an alkyl group, an alkenyl group, an alkynyl group and the like. The alkyl group, the alkenyl group and the alkynyl group as the substituent respectively have preferably 1 to 5 carbon atoms, more preferably 1 to 3 carbon atoms.

Among them, the aromatic hydrocarbon group is preferable, and a polycyclic aromatic hydrocarbon group is more preferable as the hydrocarbon group for $R^{11}$, since the carbon amount of the resin can be increased. Those having no substituent are more preferable.

Specific examples of $R^{11}$ are shown below. In the following formula, the mark "*" indicates a bond to be bonded to a nitrogen atom in the general formula (u11-1).

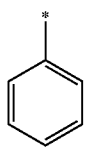
(u11-11-1)

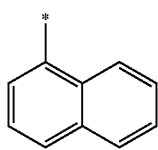
(u11-11-2)

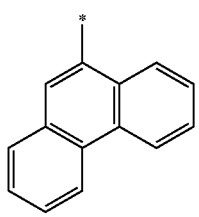
(u11-11-3)

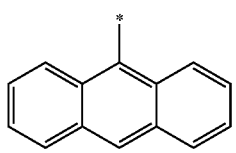
(u11-11-4)

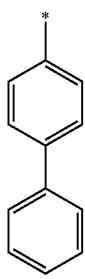
(u11-11-5)

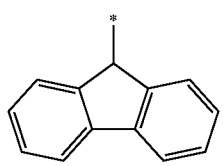
(u11-11-6)

-continued

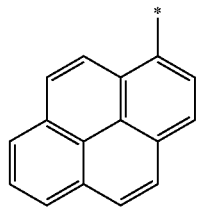
(u11-11-7)

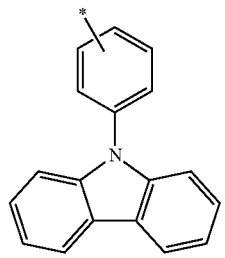
(u11-11-8)

Specific examples of the structural unit (u11) are shown below.

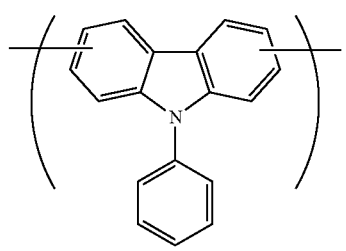
(u11-1)

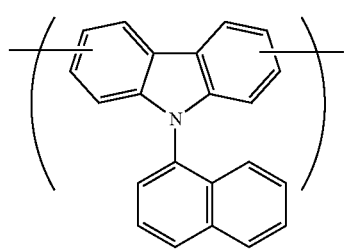
(u11-2)

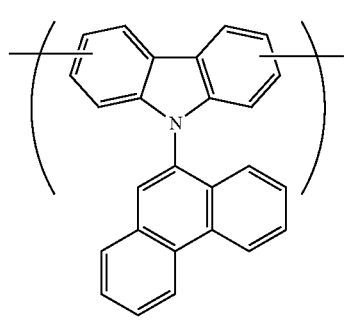
(u11-3)

-continued

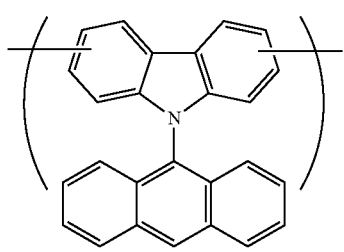
(u11-4)

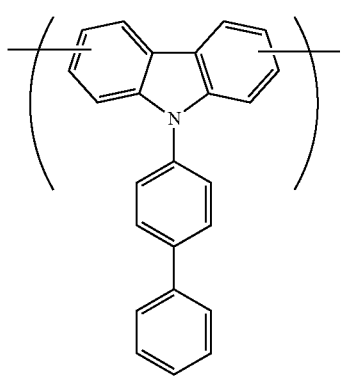
(u11-5)

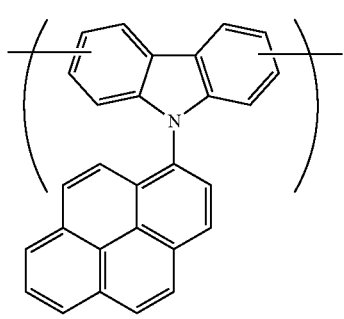
(u11-6)

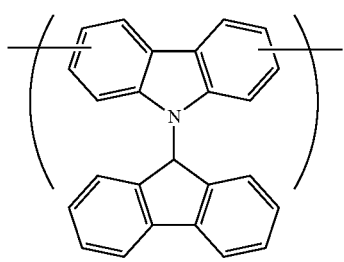
(u11-7)

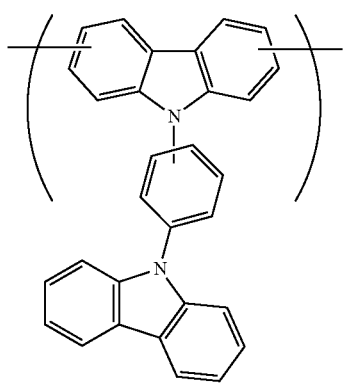
(u11-8)

The first resin may have one kind of the structural unit (u11), or two or more kinds of the structural unit (u11).

A proportion of the structural unit (u11) in the first resin is preferably 1 to 60 mol %, more preferably 3 to 50 mol %, with respect to the total sum of all structural units constituting the first resin.

By setting the proportion of the structural unit (u11) to be greater than equal to the lower limit value of the preferable range described above, etching resistance and heat resistance are improved. Further, by setting the proportion of the structural unit (u11) to be equal to or less than the upper limit value of the preferable range described above, the structural unit (u11) and other structural units can be balanced.

Structural Unit (u12)

The structural unit (u12) is a structural unit represented by the general formula (u12-1). In the general formula (u12-1), $R^{12}$ represents an aromatic hydrocarbon group having 6 to 30 carbon atoms which may have a substituent. The aromatic hydrocarbon group has preferably 6 to 25 carbon atoms.

Examples of the aromatic hydrocarbon group for $R^{12}$ include the same as those exemplified as the aromatic hydrocarbon group for $R^{11}$ in the general formula (u 11-1).

The aromatic hydrocarbon group for $R^{12}$ may or may not have a substituent. Examples of the substituent include the same as those exemplified as the substituent of the aromatic hydrocarbon group for $R^{11}$. Preferred examples of the substituent include a linear or branched alkyl group having 1 to 3 carbon atoms. The aromatic hydrocarbon group for $R^{12}$ is preferably a group having no substituent from the viewpoint of increasing the carbon amount of the resin.

Specific examples of $R^{12}$ are shown below. In the following formula, the mark "*" indicates a bond to be bonded to a carbon atom in the general formula (u12-1).

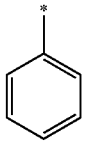
(u12-12-1)

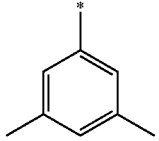
(u12-12-2)

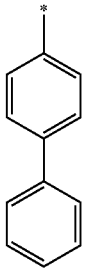
(u12-12-3)

(u12-12-4)

-continued

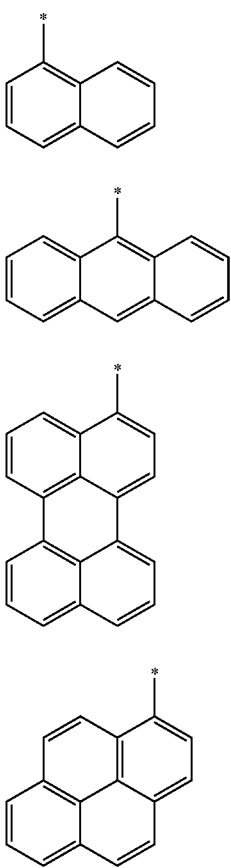

(u12-12-5)

(u12-12-6)

(u12-12-7)

(u12-12-8)

Specific examples of the structural unit (u12) are shown below.

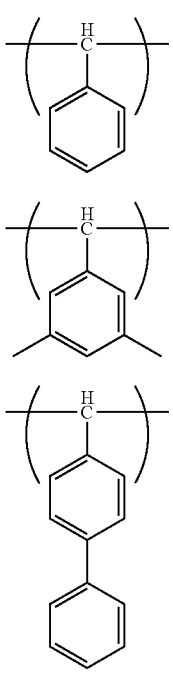

(u12-1)

(u12-2)

(u12-3)

-continued

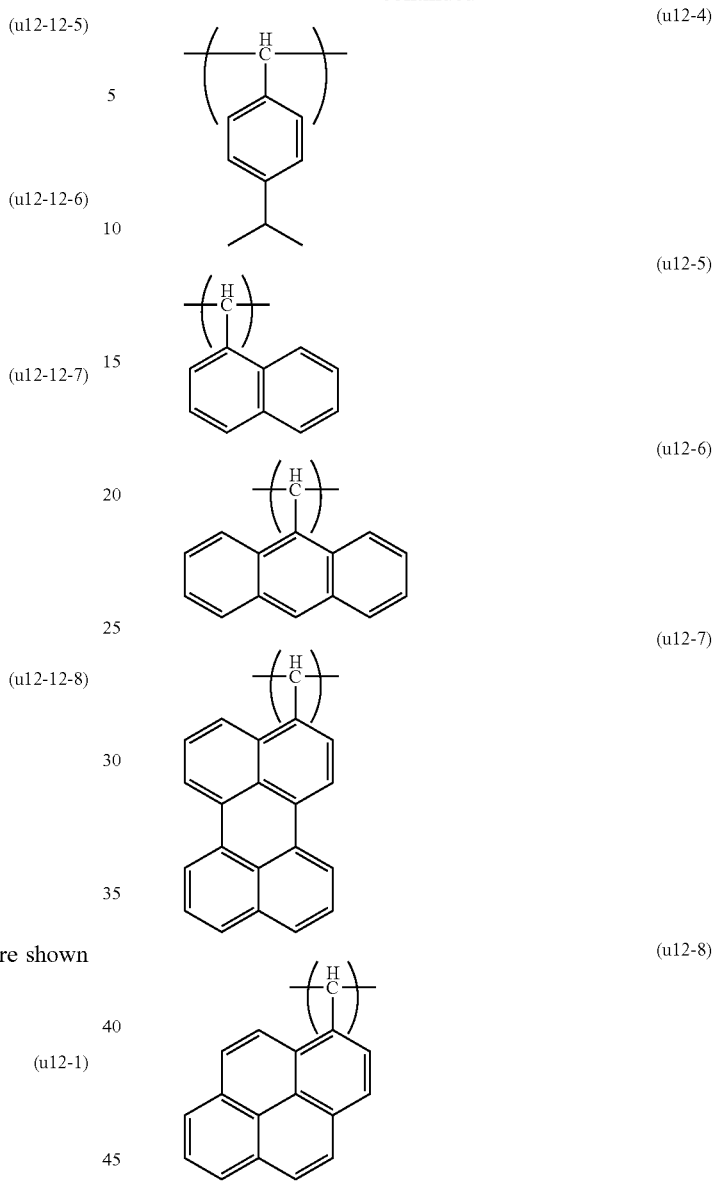

(u12-4)

(u12-5)

(u12-6)

(u12-7)

(u12-8)

The first resin may have one kind of the structural unit (u12), or two or more kinds of the structural unit (u12).

A proportion of the structural unit (u12) in the first resin is preferably 30 to 70 mol %, more preferably 40 to 60 mol %, still more preferably 50 mol %, with respect to the total sum of all structural units constituting the first resin.

By setting the proportion of the structural unit (u12) to be greater than or equal to the lower limit value of the preferable range described above, etching resistance and heat resistance are improved. Further, by setting the proportion of the structural unit (u12) to be equal to or less than the upper limit value of the preferable range described above, the structural unit (u12) and other structural unit can be balanced.

Structural Unit (u13)

The structural unit (u13) is a structural unit represented by the general formula (u13-1). In the general formula (u13-1), $R^{13}$ represents a polycyclic hydrocarbon group of 10 to 30 carbon atoms which may have a substituent. The polycyclic hydrocarbon group has preferably 10 to 25 carbon atoms.

The polycyclic aromatic hydrocarbon group for $R^{13}$ is an aromatic hydrocarbon group containing two or more aromatic rings. Specific examples of the aromatic ring include an aromatic hydrocarbon ring such as benzene, naphthalene, anthracene, phenanthrene, pyrene or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom and the like. Specific examples of the aromatic heterocyclic ring include a pyrrolidine ring, a pyridine ring, a thiophene ring and the like.

Specific examples of the aromatic hydrocarbon group for $R^{13}$ include a group (an arylene group or a heteroarylene group) obtained by removing two hydrogen atoms from the aromatic hydrocarbon ring or aromatic heterocyclic ring; a group obtained by removing two hydrogen atom from an aromatic compound (for example, biphenyl, fluorene, perylene and the like) containing two or more aromatic rings; and the like.

The aromatic hydrocarbon group for $R^{13}$ may or may not have a substituent. Examples of the substituent include the same as those exemplified as the substituent of the aromatic hydrocarbon group for $R^{11}$. Preferred examples of the substituent include a linear or branched alkyl group having 1 to 3 carbon atoms. The aromatic hydrocarbon group for $R^{13}$ is preferably a group having no substituent from the viewpoint of increasing the carbon amount of the resin.

Specific examples of $R^{13}$ are shown below. In the following formula, the mark "*" indicates a bond to be bonded to a carbon atom in the general formula (u13-1).

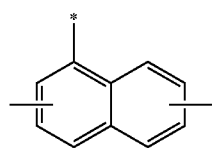
(u13-13-1)

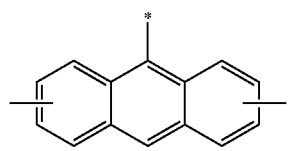
(u13-13-2)

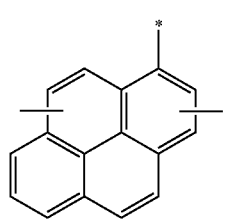
(u13-13-3)

-continued

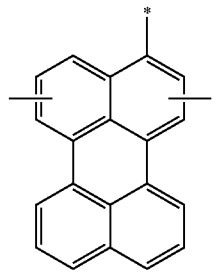
(u13-13-4)

Specific examples of the structural unit (u13) are shown below.

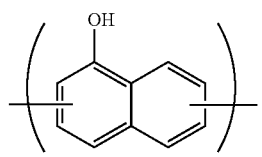
(u13-1)

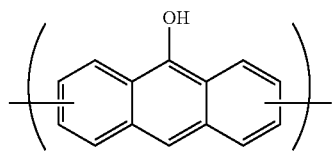
(u13-2)

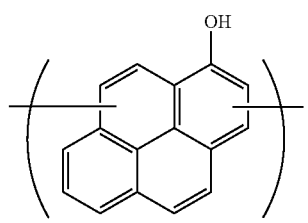
(u13-3)

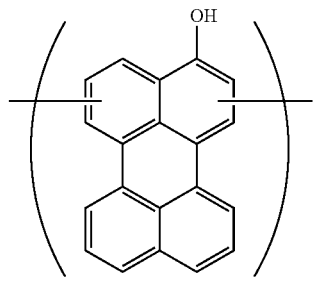
(u13-4)

The first resin may have one kind of the structural unit (u13), or two or more kinds of the structural unit (u13).

A proportion of the structural unit (u13) in the first resin is preferably 1 to 60 mol %, more preferably 3 to 50 mol %, with respect to the total sum of all structural units constituting the first resin.

By setting the proportion of the structural unit (u13) to be greater than or equal to the lower limit value of the preferable range described above, etching resistance and heat resistance are improved. Further, by setting the proportion of the structural unit (u13) to be equal to or less than the upper limit value of the preferable range described above, the structural unit (u13) and other structural units can be balanced.

The first resin may have other structural units in addition to the structural unit (u11), the structural unit (u12), and the structural unit (u13). A structural unit with a high carbon amount is preferred as the other structural units. For example, a structural unit containing an aromatic hydrocarbon group is an exemplary example.

Examples of the first resin include a resin having the structural unit (u11) and the structural unit (u12); a resin having the structural unit (u12) and the structural unit (u13); a resin having the structural unit (u11), the structural unit (u12), the structural units (u13); and the like. Examples of such a resin include a copolymer of a monomer from which the structural unit (u11) is derived and a monomer from which the structural unit (u12) is derived; a copolymer of a monomer from which the structural unit (u12) is derived and a monomer from which the structural unit (u13) is derived; a copolymer of a monomer from which the structural unit (u11) is derived, a monomer from which the structural unit (u12) is derived, and a monomer from which the structural unit (u13) is derived; and the like.

A mass average molecular weight (Mw) (in terms of polystyrene according to gel permeation chromatography (GPC)) of the first resin is not particularly limited, and is preferably about 1000 to 500000, more preferably about 3000 to 50000. Excellent etching resistance and heat resistance are obtained as Mw of the first resin falls within the preferable range described above.

A dispersion degree (Mw/Mn) of the first resin is not particularly limited, and is preferably about 1.0 to 4.0, more preferably about 1.0 to 3.0, particularly preferably about 1.0 to 2.5. Mn indicates a number average molecular weight.

The Ohnishi parameter of the first resin is preferably 3.0 or less, more preferably 2.0 or less. The Ohnishi parameter of the first resin falls within a range of 1.0 to 3.0, preferably a range of 1.0 to 2.0. The Ohnishi parameter is generally used as an indicator of resin etch resistance (J. Electrochem Soc., 143, 130 (1983), H. Gokan, S. Esho and Y. Ohnishi). The Ohnishi parameter is a parameter that is generally used to express carbon density, and in particular is calculated by [total number of atoms of C, H, O]/([number of C atoms]–[number of O atoms]). The lower the Onishi parameter, the better the etching resistance.

The thermal decomposition temperature of the first resin is preferably 400° C. or more, more preferably 410° C. or more. The thermal decomposition temperature of the first resin falls within, for example, a range of 400 to 500° C., preferably a range of 410 to 450° C. The thermal decomposition temperature is a temperature at which the mass decreases by 5% with respect to the mass of the resin at 240° C. by thermogravimetric analysis (TGA).

One kind of the first resin, or two or more kinds of the first resin in combination may be used.

The proportion of the first resin in the hard-mask forming composition is preferably 50 to 95% by mass or more, more preferably 60 to 90% by mass, still more preferably 65 to 85% by mass, with respect to the total mass of all resins contained in the hard-mask forming composition. By setting the proportion to be greater than or equal to the lower limit value of the preferable range described above, etching resistance and heat resistance of the hard-mask forming composition are improved. Further, setting by the proportion to be equal to or less than the upper limit value of the preferable range described above, cracks hardly occur when the hard mask layer is thickened.

The first resin can be prepared by, for example, condensing the monomer from which the structural unit (u12) is derived, and either or both of the monomer from which the structural unit (u11) is derived and the monomer from which the structural unit (u13) is derived, in the presence of an acid catalyst. A phenol compound can be typically used as the monomer from which the structural unit (u11) is derived and the monomer from which the structural unit (u13) is derived. An aldehyde compound can be typically used as the monomer from which the structural unit (u12) is derived.

Specific examples of the first resin are shown below.

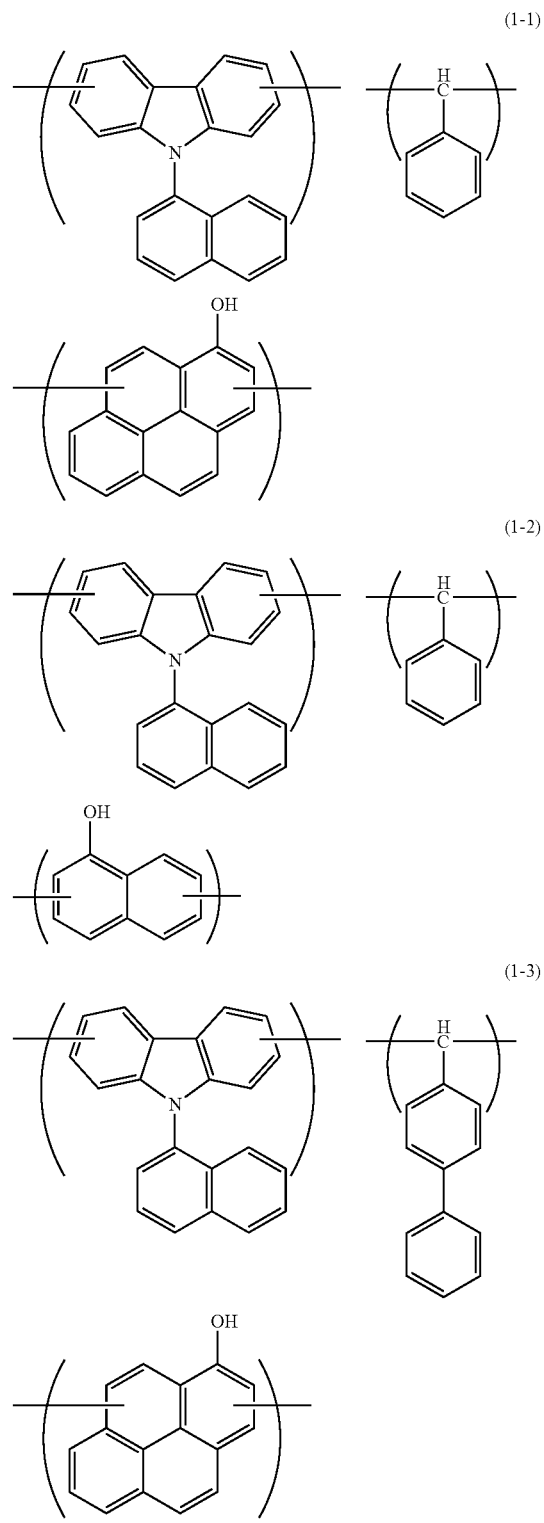

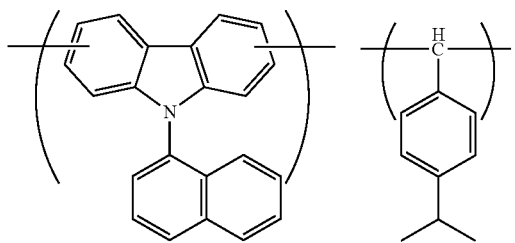

(1-4)

(1-5)

(1-6)

Second Resin

The second resin is featured that the amount of carbon contained in the second resin is 70 mass % or more with respect to the total mass of all elements constituting the second resin and less than the amount of carbon contained in the first resin. By using the second resin having such a carbon content in combination with the first resin, cracks hardly occur in the hard mask layer while maintaining excellent etching resistance and heat resistance, and thus thickening of the hard mask layer can be realized (for example, 1 μm or more).

The carbon amount in the second resin is not particularly limited as long as it is 70% by mass or more and less than the carbon amount in the first resin. The carbon amount in the second resin is preferably 73% by mass or more, more preferably 75% by mass or more, still more preferably 78% by mass or more. The upper limit of the carbon amount of the second resin is less than the carbon amount of the first resin, and varies according to the carbon amount of the first resin. The carbon amount of the second resin is lower than the carbon amount of the first resin by, for example, preferably 2% by mass or more, more preferably 5% by mass or more, still more preferably 8% by mass or more. The carbon amount of the second resin is lower than the carbon amount of the first resin by, for example, preferably 2 to 20% by mass, more preferably 5 to 15% by mass, still more preferably 8 to 13% by mass.

Examples of the structural unit contained in the second resin include a structural unit (u21) represented by the following general formula (u21-1), and a structural unit (u22) represented by the following general formula (u22-1).

In the formula, $R^{21}$ is an organic group derived from a phenol compound having at least one hydroxy group, and $R^{22}$ is an aromatic hydrocarbon group having 6 to 30 carbon atoms which may have a substituent, or a hydrogen atom.

Structural Unit (u21)

The structural unit (u21) is a structural unit represented by the general formula (u21-1). In the general formula (u21-1), $R^{21}$ represents an organic group derived from a phenol compound having at least one hydroxy group.

The phenol compound from which the organic group is derived, for $R^{21}$, is preferably a compound that can be condensed with an aldehyde to form a novolak resin or a resole resin. Examples of such a phenol compound include phenol; cresols such as m-cresol, p-cresol, o-cresol or the like; xylenols such as 2,3-xylenol, 2,5-xylenol, 3,5-xylenol, 3,4-xylenol or the like; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol or the like; alkoxyphenols such as p-methoxyphenol, m-methoxyphenol, p-ethoxyphenol, m-ethoxyphenol, p-propoxyphenol, m-propoxyphenol or the like; isopropenylphenols such as o-isopropenylphenol, p-isopropenylphenol, 2-methyl-4-isopropenylphenol, 2-ethyl-4-isopropenylphenol, or the like; arylphenols such as phenyl phenol or the like; polyhydroxyphenols such as 4,4'-dihydroxybiphenyl, bisphenol A, resorcinol, hydroquinone, pyrogallol, 9,9-bis (4-hydroxy-3,5-dimethylphenyl) fluorene, 9,9-bis (4-hydroxy-3-methylphenyl) fluorene, 1,1-bis (4-hydroxy-3-methylphenyl) cyclohexane, or the like; and the like.

Specific examples of the structural unit (u21) are shown below.

-continued (u21-2)

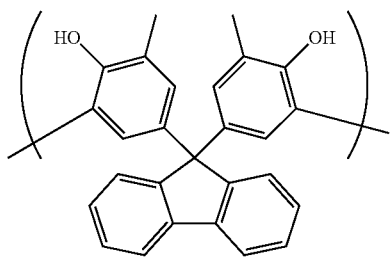

(u21-3)

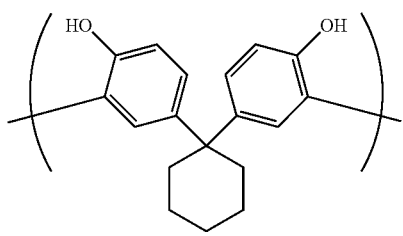

In the formula (u21-1), n is an integer of 0 to 3.

The second resin may have one kind of the structural unit (u21), or two or more kinds of the structural unit (u21).

A proportion of the structural unit (u21) in the second resin is preferably 30 to 70 mol %, with respect to the total sum of all structural units constituting the second resin.

Structural Unit (u22)

The structural unit (u22) is a structural unit represented by the general formula (u22-1). In the general formula (u22-1), $R^{22}$ represents an aromatic hydrocarbon group having 6 to 30 carbon atoms which may have a substituent, or a hydrogen atom. The aromatic hydrocarbon group has preferably 6 to 25 carbon atoms, more preferably 6 to 20 carbon atoms, still more preferably 6 to 15 carbon atoms.

Examples of the aromatic hydrocarbon group for $R^{22}$ include the same as those exemplified as the aromatic hydrocarbon group for $R^{11}$ in the general formula (u 11-1).

The aromatic hydrocarbon group for $R^{22}$ may or may not have a substituent. Examples of the substituent include the same as those exemplified as the substituent of the aromatic hydrocarbon group for $R^{11}$. Preferred examples of the substituent include a linear or branched alkyl group having 1 to 5 carbon atoms.

In particular, the structural unit (u22) is preferably a structural unit derived from an aldehyde compound containing an aromatic hydrocarbon ring or an aromatic heterocyclic ring. Specific examples of the aldehyde compound include formaldehyde, paraformaldehyde, trioxane, furfural, benzaldehyde, terephthalaldehyde, phenylacetaldehyde, α-phenylpropyl aldehyde, β-phenylpropyl aldehyde, o-hydroxy benzaldehyde, m-hydroxy benzaldehyde, p-hydroxy benzaldehyde, o-methyl benzaldehyde, m-methyl benzaldehyde, p-methyl benzaldehyde, o-chlorobenzaldehyde, m-chlorobenzaldehyde, p-chlorobenzaldehyde, cinnamaldehyde, 4-isopropyl benzaldehyde, 4-isobutyl benzaldehyde, 4-phenyl benzaldehyde and the like.

Specific examples of the structural unit (u22) are shown below.

$-\!\!\left(\!CH_2\!\right)\!\!-$ (u22-1)

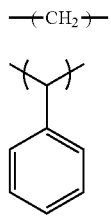 (u22-2)

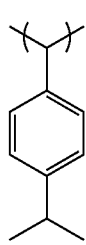 (u22-3)

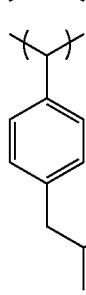 (u22-4)

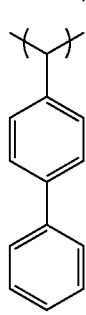 (u22-5)

The second resin may have one kind of the structural unit (u22), or two or more kinds of structural unit (u22).

A proportion of the structural unit (u22) in the second resin is preferably 30 to 70 mol %, with respect to the total sum of all structural units constituting the second resin.

The second resin may have other structural units in addition to the structural unit (u21) and the structural unit (u22). Examples of the other structural unit include a structural unit containing a hydrocarbon group and the like.

Examples of the second resin include a resin having the structural unit (u21) and the structural unit (u22), and the like. Examples of such a resin include a copolymer of a monomer from which the structural unit (u21) is derived and a monomer from which the structural unit (u22) is derived, and the like.

In particular, the second resin is preferably a novolac resin or a resole resin, more preferably a novolac resin.

A mass average molecular weight (Mw) (in terms of polystyrene conversion according to gel permeation chromatography (GPC)) of the second resin is not particularly limited, and is preferably about 1000 to 100000.

A dispersion degree (Mw/Mn) of the second resin is not particularly limited, and is preferably about 1 to 50. Mn indicates a number average molecular weight.

One kind of the second resin, or two or more kinds of the second resin in combination may be used.

The proportion of the second resin in the hard-mask forming composition is preferably 5 to 50% by mass, more preferably 10 to 40% by mass, still more preferably 15 to 35% by mass, with respect to the total mass of all resins contained in the hard-mask forming composition.

A ratio (mass ratio) of the first resin to the second resin is preferably 50/50 to 95/5, more preferably 60/40 to 90/10, still more preferably, 65/35 to 80/20. By setting the proportion to fall within the preferable range described above, cracks hardly occur in the hard mask layer when the hard mask layer is thickened, while maintaining excellent etching resistance and heat resistance.

The second resin can be prepared by, for example, condensing the monomer from which the structural unit (u21) is derived and the monomer from which the structural unit (u22) is derived, in the presence of an acid catalyst or an alkali catalyst. A phenol compound can be typically used as the monomer from which the structural unit (u21) is derived. An aldehyde compound can be typically used as the monomer from which the structural unit (u22) is derived. The acid catalyst is not particularly limited, and examples thereof include hydrochloric acid, nitric acid, sulfuric acid, formic acid, oxalic acid, acetic acid and the like.

A commercially available novolak resin or resol resin may be used as the second resin. Examples of commercially available novolak resin and resole resin include PR-53364, PR-53365 (collectively manufactured by Sumitomo Bakelite), and the like.

Specific examples of the second resin are shown below.

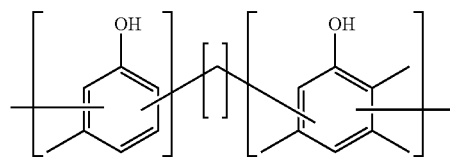

(2-1)

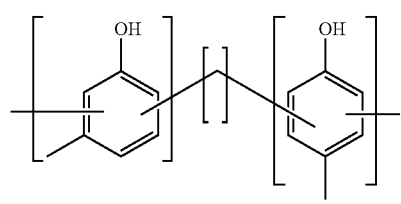

(2-2)

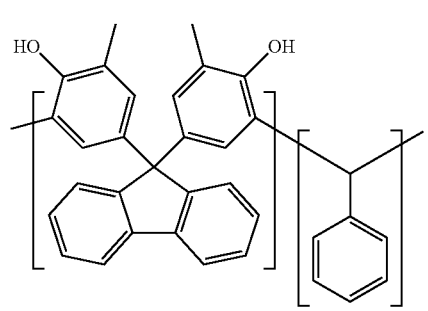

(2-3)

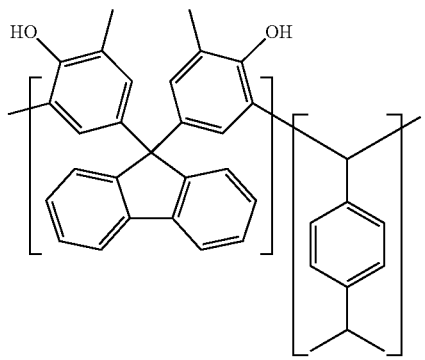

(2-4)

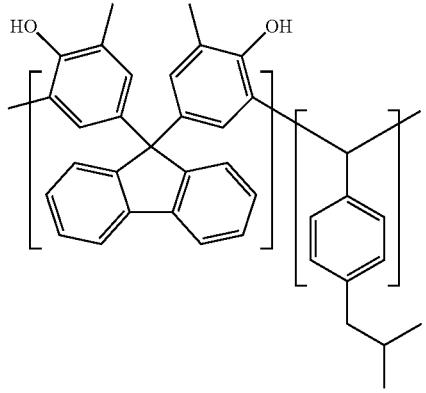

(2-5)

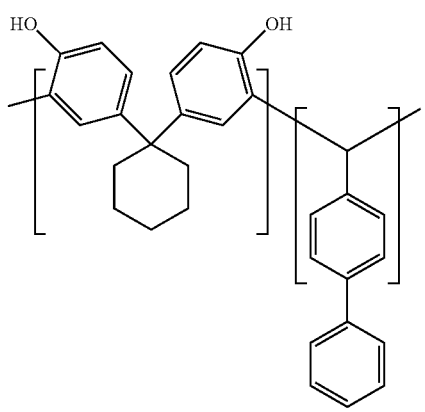

(2-6)

Optional Components

The hard-mask forming composition of the present embodiment may contain other components in addition to the first resin and the second resin. Examples of the other components include a crosslinking agent, a crosslinking acceleration catalyst, a photoacid generator, an absorbent, a rheology modifier, an adhesion aider, a surfactant, a solvent and the like.

Examples of the crosslinking agent include an amino-based crosslinking agent such as glycoluril having a methylol group or an alkoxymethyl group; a melamine-based crosslinking agent; and the like. A specific example is Nikarak (registered trademark) series, manufactured by Sanwa Chemical Co., Ltd., such as Nikalac MX 270. A blending amount of the crosslinking agent is preferably 1 to 50 parts by mass, more preferably 1 to 40 parts by mass, with respect to 100 parts by mass of all resin components in the hard-mask forming composition. One kind of crosslinking agent, or two or more kinds of crosslinking agents in combination may be used.

Examples of the crosslinking acceleration catalyst include an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, naphthalenecarboxylic acid or the like; a thermal acid generator such as 2,4,4,6-tetrabromocyclohexadienone, benzoin tosylate, 2-nitrobenzyl tosylate, other organic sulfonic acid alkyl esters or the like; and the like. A blending amount of the crosslinking acceleration catalyst is preferably 0.0001 to 20 parts by mass, more preferably 0.0005 to 10 parts by mass, still more preferably 0.01 to 3 parts by mass, with respect to 100 parts by mass of all resin components in the hard-mask forming composition. One kind of crosslinking acceleration catalyst, or two or more kinds of crosslinking acceleration catalysts in combination may be used.

Examples of the photoacid generator include onium salt photoacid generators such as bis (4-t-butylphenyl) iodonium trifluoromethanesulfonate, triphenylsulfonium trifluoromethanesulfonate or the like; halogen-containing compound photoacid generators such as phenyl-bis (trichloromethyl)-s-triazine or the like; sulfonic acid photoacid generators such as benzoin tosylate, N-hydroxysuccinimide trifluoromethanesulfonate or the like; and the like. A blending amount of the photoacid generator is preferably 0.2 to 10 parts by mass, more preferably 0.4 to 5 parts by mass, with respect to 100 parts by mass of all resin components in the hard-mask forming composition. One kind of photoacid generator, or two or more kinds of photoacid generators in combination may be used.

Examples of the absorbent include commercially available absorbents listed in "Technology and Market for Industrial Dyes" (published by CMC) and "Dyes Handbook" (edited by the Society of Synthetic Organic Chemistry), for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. I. Disperse Blue 96; C. I. Fluorescent Brightening Agents 112, 135 and 163; C. I. Solvent Orange 2 and 45; C. I. Solvent Red 1, 3, 8, 23, 24, 25, 27 and 49; C. I. Pigment Green 10; C. I. Pigment Brown 2; and the like. A blending amount of the absorbent is preferably 10 parts by mass or less, more preferably 5 parts by mass or less, with respect to 100 parts by mass of all resin components in the hard-mask forming composition. One kind of absorbent, or two or more kinds of absorbents in combination may be used.

Examples of the rheology modifier include phthalic acid derivatives such as dimethyl phthalate, diethyl phthalate, diisobutyl phthalate, dihexyl phthalate, butyl isodecyl phthalate or the like; adipic acid derivatives such as dinormal butyl adipate, diisobutyl adipate, diisooctyl adipate, octyl decyl adipate or the like; Maleic acid derivatives such as dinormal butyl malate, diethyl malate, dinonyl malate or the like; Oleic acid derivatives such as methyl oleate, butyl oleate, tetrahydrofurfuryl oleate, or the like; and stearic acid derivatives such as normal butyl stearate, glyceryl stearate or the like. A blending amount of the rheology modifier is preferably less than 30 parts by mass, with respect to 100 parts by mass of all resin components in the hard-mask forming composition. One kind of rheology modifier, or two or more kinds of rheology modifiers in combination may be used.

Examples of the adhesion aider include chlorosilanes such as m-trimethylchlorosilane, dimethylvinylchlorosilane, methyldiphenylchlorosilane, chloromethyldimethylchlorosilane or the like; alkoxysilanes such as trimethylmethoxysilane, dimethyldiethoxysilane, methyldimethoxysilane, dimethylvinylethoxysilane, diphenyldimethoxysilane, phenyltriethoxysilane or the like; silazanes such as hexamethyldisilazane, N, N'-bis (trimethylsilyl) urea, dimethyltrimethylsilylamine, trimethylsilylimidazole or the like; Silanes such as vinyltrichlorosilane, γ-chloropropyltrimethoxysilane, γ-aminopropyltriethoxysilane, γ-glycidoxypropyltrimethoxysilane or the like; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine or the like; urea such as 1,1-dimethylurea, 1,3-dimethylurea or the like; and thiourea compounds. A blending amount of the adhesion aider is preferably less than 5 parts by mass, more preferably 2 parts by mass, with respect to 100 parts by mass of all resin components in the hard-mask forming composition. One kind of adhesion aider, or two or more kinds of adhesion aiders in combination may be used.

Examples of the surfactant include a nonionic surfactant encompassing: polyoxyethylene alkyl ethers such as polyoxyethylene lauryl ether, polyoxyethylene stearyl ether, polyoxyethylene cetyl ether, polyoxyethylene oleyl ether or the like; polyoxyethylene alkyl allyl ethers such as polyoxyethylene octyl phenol ether, polyoxyethylene nonyl phenol ether or the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate or the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate or the like; and the like. Other examples of the surfactant include a fluorinated surfactant such as F-top (registered trademark) EF 301, EF 303 and EF 352 (collectively manufactured by Mitsubishi Materials Electronic Chemicals Co., Ltd. (formerly Tochem Products), product names), Megafac (registered trademark) F171, F173 and R-30 (collectively manufactured by DIC Corporation (formerly Dai Nippon Ink Co., Ltd.), product names), Fluorad FC430 and FC431 (collectively manufactured by Sumitomo 3M Co., Ltd., product names), AsahiGuard (registered trademark) AG710, Surflon (registered trademark) S-382, SC101, SC102, SC103, SC104, SC105 and Sc106 (collectively manufactured by Asahi Glass Co., Ltd., product names), or the like; Organosiloxane Polymer KP 341 (manufactured by Shin-Etsu Chemical Co., Ltd., product name); and the like. A blending amount of the surfactant is preferably 2.0 parts by mass or less, more preferably 1.0 parts by mass or less, with respect to 100 parts by mass of all resin components in the hard-mask forming composition. One kind of surfactant, or two or more kinds of surfactants in combination may be used.

A solvent is used to dissolve the first resin, the second resin, and the optional components. Examples of the solvent include lactones such as γ-butyrolactone or the like; ketones such as acetone, methyl ethyl ketone, cyclohexanone, methyl-n-pentyl ketone, methyl isopentyl ketone, 2-heptanone or the like; polyhydric alcohols such as ethylene glycol, diethylene glycol, propylene glycol, dipropylene glycol or the like; derivatives of polyhydric alcohols which include compounds having an ester bond such as ethylene glycol monoacetate, diethylene glycol monoacetate, propylene glycol monoacetate, or dipropylene glycol monoacetate, compounds having an ether bond such as monoalkyl ethers (including monomethyl ether, monoethyl ether, monopropyl ether and monobutyl ether) or monophenyl ether of the polyhydric alcohol or the compound having the ester bond, and the like (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate or the like; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, mesitylene or the like; dimethyl sulfoxide (DMSO); and the like. Among these, it is preferred to employ propylene glycol monomethyl ether, propylene glycol monomethyl ether acetate, ethyl lactate, butyl lactate, cyclohexanone and the like, from the viewpoint of further improving the leveling property.

The solvent may be used alone or be a mixture solvent of two or more solvents. The amount of the solvent used is not particularly limited, and is appropriately set to a concentration applicable to a substrate or the like, depending on the thickness of a coating film thickness. For example, the solvent may be blended so that the resin component concentration in the hard-mask forming composition falls within a range of 1 to 50% by mass, preferably a range of 15 to 35% by mass.

The hard-mask forming composition according to the embodiment is capable of forming a hard mask layer having good etching resistance and heat resistance with the reduced occurrence of crack, since it employs the first resin having the high carbon amount of 85% by mass or more in combination with the second resin having the carbon amount slightly lower than that of the first resin. Accordingly, since the hard mask layer can be thickened (for example, 1 μm or more), it can be suitably used as a hard-mask forming composition for deep processing.

Method for Manufacturing Electronic Component

First Embodiment

The method for manufacturing an electronic component according to the second aspect of the present invention includes steps of:

forming a hard mask layer (m1) on a support using the hard-mask forming composition according to the first aspect (hereinafter referred to as "step (i)");

forming a hard mask layer (m2) made of an inorganic material on the hard mask layer (m1) (hereinafter referred to as "step (ii)");

forming a resist film on the hard mask layer (m2) (hereinafter referred to as "step (iii)");

forming a resist pattern on the hard mask layer (m2) by exposing and developing the resist film (hereinafter referred to as "step (iv)");

etching the hard mask layer (m2) with the resist pattern as a mask to form an inorganic pattern (hereinafter referred to as "step (v)");

etching the hard mask layer (m1) with the inorganic pattern as a mask to form a resin pattern (hereinafter referred to as "step (vi)"); and processing the support with the resin pattern as a mask (hereinafter referred to as "step (vii)").

A specific example of the method for manufacturing an electronic component according to an embodiment will be described below with reference to FIGS. 1 to 8. However, the manufacturing method according to the embodiment is not limited thereto.

FIG. 1 shows a support 10 formed by a substrate 11 and a processing layer 12.

Figure 2:
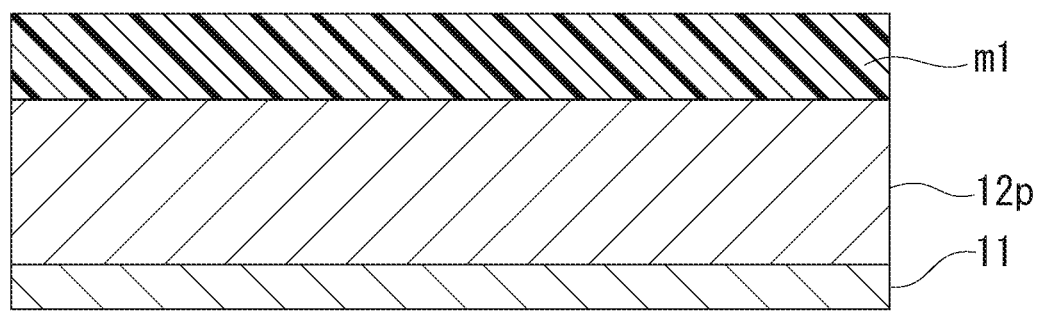
FIG. 2 is a view showing an exemplary example of a process of forming a hard mask layer (m1) in the method for manufacturing an electronic component according to the embodiment of the present invention.

First, the hard mask layer (m1) is formed on the support 10 using the hard-mask forming composition according to the first aspect (FIG. 2; step (i)).

Figure 3:
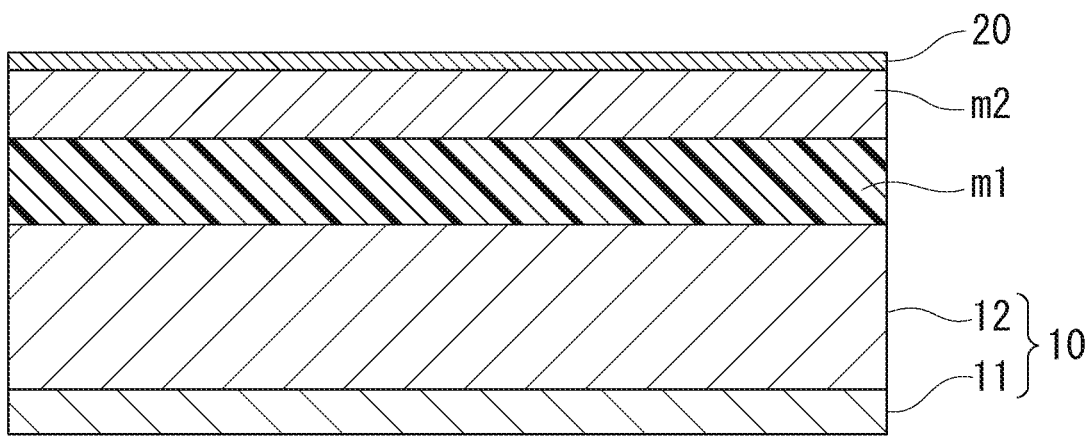
FIG. 3 is a view showing an exemplary example of a process of forming a hard mask layer (m2) in the method for manufacturing an electronic component according to the embodiment of the present invention.

The hard mask layer (m2) made of the inorganic material is formed on the hard mask layer (m1) (FIG. 3; step (ii)). An antireflective film (BARC) 20 is formed on the hard mask layer (m2) if needed.

Figure 4:
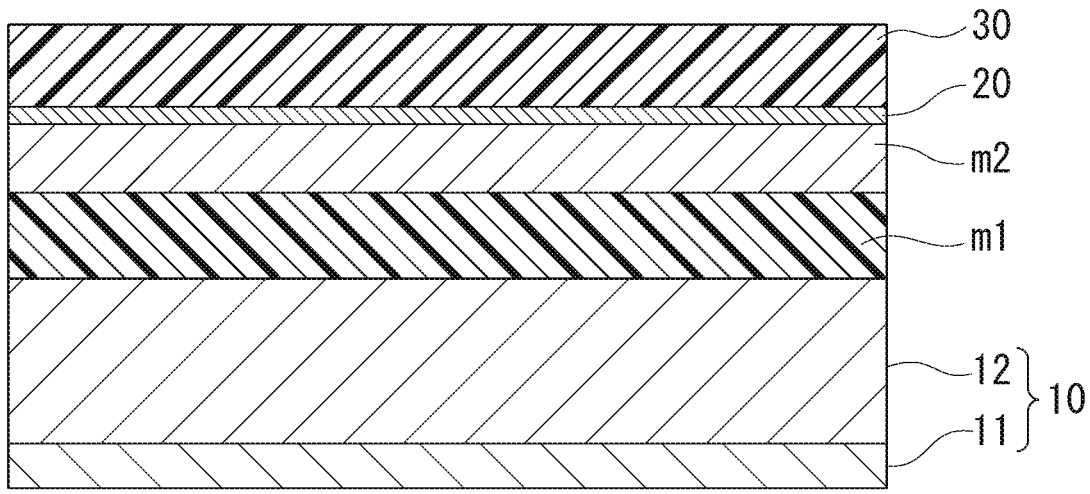
FIG. 4 is a view showing an exemplary example of a process of forming a resist film in the method for manufacturing an electronic component according to the embodiment of the present invention.

A resist film 30 is formed on the hard mask layer (m2) using a resist composition (FIG. 4; step (iii)).

Figure 5:
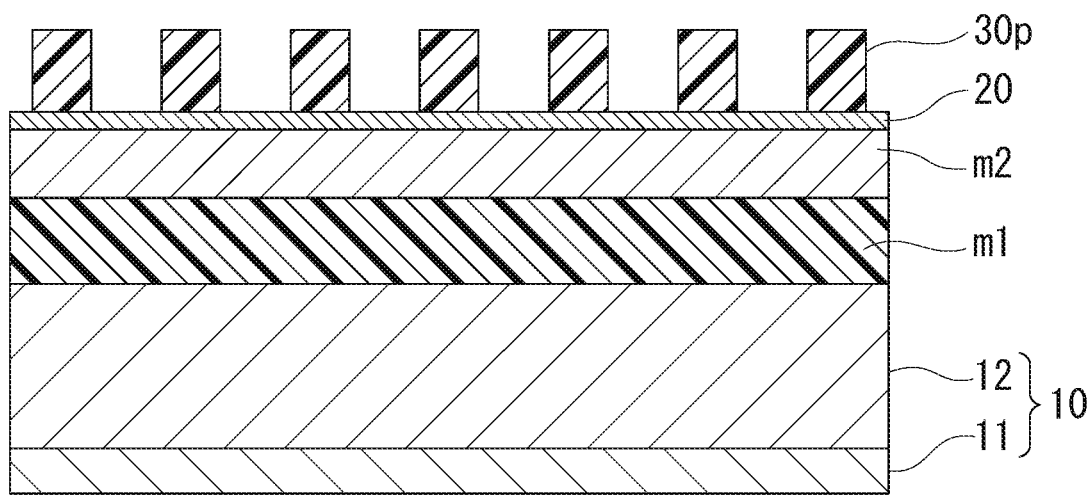
FIG. 5 is a view showing an exemplary example of a process of forming a resist pattern in the method for manufacturing an electronic component according to the embodiment of the present invention.

A resist pattern 30p is formed on the hard mask layer (m2) by exposing and developing the resist film (FIG. 5; step (iv)).

Figure 6:
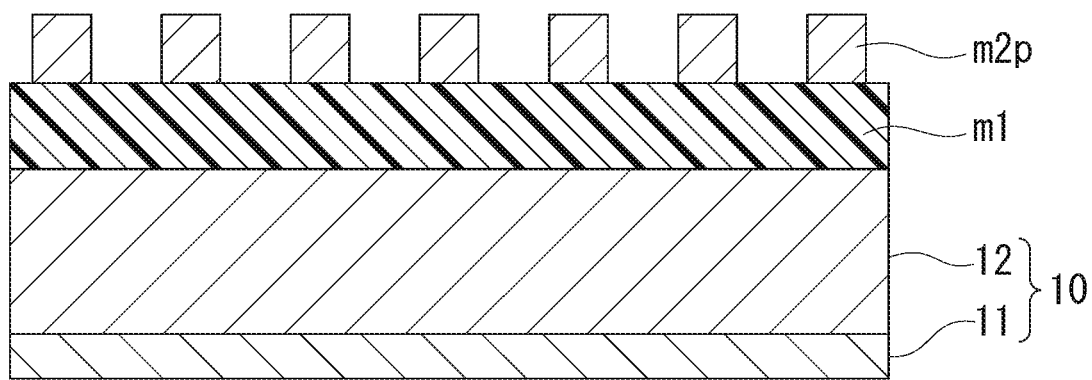
FIG. 6 is a view showing an exemplary example of a process of forming an inorganic pattern in the method for manufacturing an electronic component according to the embodiment of the present invention.

The hard mask layer (m2) is etched with the resist pattern 30p as a mask to form an inorganic pattern (m2p) (FIG. 6; step (v)).

Figure 7:
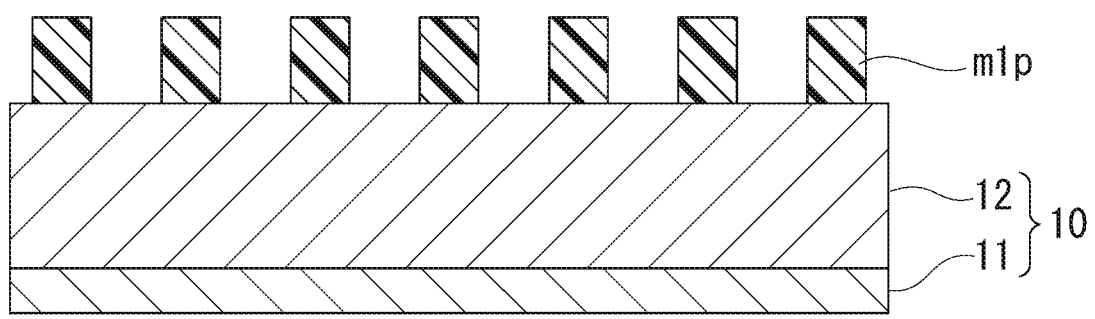
FIG. 7 is a view showing an exemplary example of a process of forming a resin pattern in the method for manufacturing an electronic component according to the embodiment of the present invention.

The hard mask layer (m1) is etched with the inorganic pattern (m2p) as a mask to form a resin pattern (m1p) (FIG. 7; step (vi)).

Figure 8:
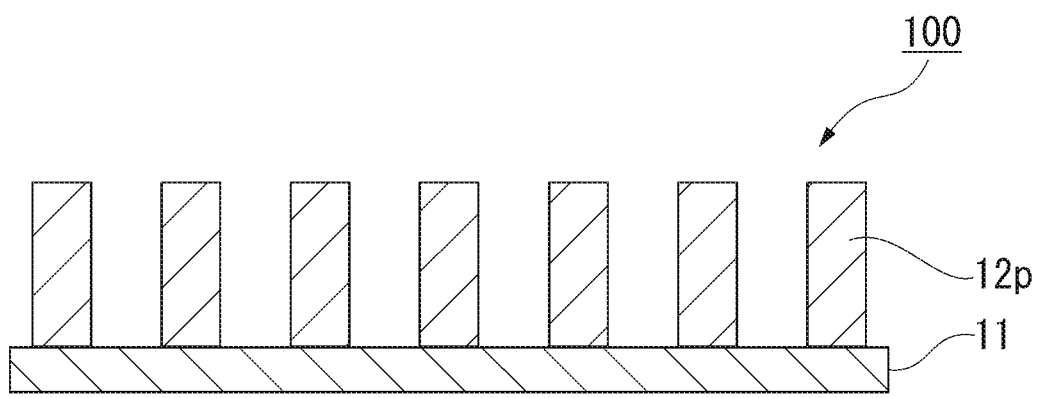
FIG. 8 is a view showing an exemplary example of a process of processing the support in the method for manufacturing an electronic component according to the embodiment of the present invention.

The support 10 is processed with the resin pattern (m1p) as a mask to form a pattern 12p (FIG. 8; step (vii)).

Thus, the electronic component 100 provided with the pattern 12p on the substrate 11 can be fabricated.

Step (i)

Step (i) is a step of forming the hard mask layer (m1) using the hard-mask forming composition according to the first aspect on the support 10.

The support 10 is not particularly limited and a known support can be used. Examples thereof include an electronic component substrate, a substrate on which a predetermined wiring pattern is formed, and the like. In particular, specific examples of the support include silicon wafers, metal substrates made of copper, chromium, iron, and aluminum, glass substrates, and the like. The wiring pattern can be formed with a material such as copper, aluminum, nickel, gold or the like.

Additionally, the support 10 may be a support in which the processing layer 12 is formed on the substrate 11. Examples of the processing layer 12 include various low-k films such as films of Si, $SiO_2$, SiON, SiN, p-Si, α-Si, W, W—Si, Al, Cu and Al—Si, and stopper films thereof. The processing layer 12 usually has a thickness of 50 to 10,000 nm. In a case of performing deep processing, the thickness of the processing layer 12 may fall within a range of 1,000 to 10,000 nm. When the processing layer 12 is formed, the processing layer 12 is typically made of a material different from that of the substrate 11.

The hard mask layer (m1) is formed using the hard-mask forming composition according to the first aspect. In particular, the hard-mask forming composition according to the first aspect is applied onto the support 10 by spin coating or the like. The hard mask layer (m1) is formed by baking and curing the layer coated on the support 10. The layer is baked at a temperature falling within a range of 100° C. to 500° C., preferably a range of 200° C. to 450° C., more preferably a range of 300° C. to 400° C. By setting the baking temperature to be equal or less than the upper limit value of the range described above, it is possible to suppress decrease in etching resistance due to the oxidation reaction of the resin. By setting the baking temperature to be greater than or equal to the lower limit value of the range described above, it is possible to suppress deterioration due to high temperature upon film formation in step (ii) mentioned below can be suppressed. The baking time falls usually within a range of 10 to 600 seconds, preferably a range of 30 to 300 seconds, more preferably a range of 50 to 200 seconds.

The thickness of the hard mask layer (m1) is not particularly limited, and can be appropriately set according to the thickness of the processing layer 12. The thickness of the hard mask layer (m1) may fall within a range of 30 to 20,000 nm. In a case of performing deep processing, the thickness of the hard mask layer (m1) is preferably 1,000 nm or more. In this case, the thickness of the hard mask layer (m1) falls within preferably a range of 1,000 to 20,000 nm, more preferably a range of 1,000 to 15,000 nm.

Step (ii)

Step (ii) is a step of forming the hard mask layer (m2) made of the inorganic material on the hard mask layer (m1).

The inorganic material for forming the hard mask layer (m2) is not particularly limited, and known materials can be used. Examples of the inorganic material include a silicon oxide film ($SiO_2$ film), a silicon nitride film ($Si_3N_4$ film), a silicon oxynitride film (SiON film), and the like. Among them, a SiON film having a high effect as an antireflective film is preferable. The hard mask layer (m2) can be formed by CVD or ALD method. The thickness of the hard mask layer (m2) is, for example, about 5 to 200 nm, preferably about 10 to 100 nm.

In a case where the CVD or ALD method is used to form the hard mask layer (m2), a temperature becomes high (about 400° C.), and thus the hard mask layer (m1) is required to have high temperature resistance. The hard-mask forming composition according to the first aspect is excellent in heat resistance, and does not easily cause shrinkage even when exposed to the high temperature of about 400° C. Therefore, it can be suitably used in combination with the inorganic hard mask layer formed by the CVD or ALD method.

After forming the hard mask layer (m2), if needed, the antireflective film (BARC) 20 may be formed on the hard mask layer (m2). The BARC 20 may be an organic BARC or inorganic BARC. BARC can be formed using methods already known in the art.

Step (iii)

Step (iii) is a step of forming the resist film 30 on the hard mask layer (m1) using the resist composition.

The resist composition is not particularly limited, and those proposed as a resist material suitable for a method using an exposure step can be generally used. The resist composition may be positive or negative. Examples of the resist composition include those containing a base component of which solubility in a developer changes due to action of the acid, and an acid generator component that generates the acid upon exposure.

The formation of the resist film 30 is not particularly limited, and a method generally used for forming the resist film may be used. For example, the resist composition is applied by a spinner on the hard mask layer (m2) (in a case where the BARC 20 is formed, it is applied on the BARC 20 formed on the hard mask layer (m2)), and baked (post-apply baking (PAB)), for example, at a temperature of 80 to 150° C. for 40 to 120 seconds, preferably 60 to 90 seconds, thereby forming the resist film 30. A thickness of the resist film 30 is not particularly limited, but it is generally about 30 to 500 nm.

Step (iv)

Step (iv) is a step of forming the resist pattern 30p on the hard mask layer (m2) by exposing and developing the resist film 30.

The resist film 30 can be exposed using an exposure apparatus such as an ArF exposure apparatus, a KrF exposure apparatus, an electron beam drawing apparatus, an EUV exposure apparatus or the like. A wavelength used for exposure is not particularly limited. Exposure can be performed using ArF excimer laser, KrF excimer laser, F2 excimer laser, EUV (extreme ultraviolet), VUV (vacuum ultraviolet), EB (electron beam), radiation such as X-ray or soft X-ray, or the like. The resist film 30 may be exposed by normal exposure (dry exposure) performed in an inert gas such as air or nitrogen, or liquid immersion lithography.

For example, the resist film 30 is selectively exposed by exposure through a photomask (mask pattern) on which a predetermined pattern is formed, or by drawing with direct irradiation of the electron beam without a photomask. Subsequently, the resist film 30 is baked (post-exposure baking (PEB)), for example, at a temperature of 80 to 150° C. for 40 to 120 seconds, preferably 60 to 90 seconds.

Next, the resist film 30 is developed. A developer used for the development can be appropriately selected from commonly used developers according to a type of resist composition and a development method. For example, in a case of employing an alkali development process, an alkaline developer is used. In a case of employing a solvent development process, a developer (organic developer) containing an organic solvent is used.

Examples of the alkali developer used for development in the alkali development process include an aqueous solution of 0.1 to 10% by mass of tetramethylammonium hydroxide (TMAH).

Examples of the organic solvent contained in the organic developer used for development in the solvent development process include polar solvents such as a ketone solvent, an ester solvent, an alcohol solvent, a nitrile solvent, an amide solvent, an ether solvent or the like; a hydrocarbon solvent; and the like.

The development process can be carried out by a known development method, such as a method of immersing the support in the developer for a fixed time (dipping); a method of raising the developer on a surface of the support by surface tension and standing still for a fixed time (paddling); a method of spraying the developer on the surface of the support (spraying); a method of continuously applying the developer while scanning the developer coating nozzle at constant speed on the support rotating at constant speed (dynamic dispensing); or the like.

After the development process, the developed film is preferably rinsed. In a case of the alkali development process, the developed film is preferably rinsed using pure water, and in a case of the solvent development process, the developed film is preferably rinsed using a rinse solution containing an organic solvent.

Meanwhile, in a case of the solvent development process, after the development or rinsing, the developer or rinse solution adhering on the pattern may be removed with a supercritical fluid.

After the development or rinsing, the film is dried. The film may be baked (post baking) after the development if needed.

Therefore, the resist pattern 30p can be formed on the hard mask layer (m2).

Step (v)

Step (v) is a step of etching the hard mask layer (m2) with the resist pattern 30p as a mask to form the inorganic pattern (m2p).

A method of etching the hard mask layer (m2) is not particularly limited, and for example, common dry etching can be used. Examples of the etching method include chemical etching such as down flow etching, chemical dry etching or the like; physical etching such as sputter etching, ion beam etching or the like; and chemical-physical etching such as RIE (reactive-ion etching) or the like.

For example, in parallel plate RIE, a multilayer stack is placed in a chamber of an RIE apparatus, and necessary etching gas is introduced. When a high frequency voltage is applied to a holder of the multilayer stack placed in parallel with an upper electrode in the chamber, the etching gas is plasmified. Etching species including charged particles such as positive and negative ions or electrons, and neutral active species are present in the plasma. When these etching species are adsorbed to a lower resist layer, a chemical reaction occurs. Reaction products leave a surface and are exhausted to the outside, thereby performing etching.

Examples of the etching gas used for etching the hard mask layer (m2) include halogen-based gas. Examples of the halogen-based gas include hydrocarbon gas in which part or all of hydrogen atoms are substituted with halogen atoms such as fluorine atoms and chlorine atoms. In particular, those examples include fluorinated carbon-based gas such as tetrafluoromethane ($CF_4$) gas or trifluoromethane ($CHF_3$) gas; carbon chloride-based gas such as tetrachloromethane ($CCl_4$) gas; and the like.

Step (vi)

Step (vi) is a step of etching the hard mask layer (m1) with the inorganic pattern (m2p) as a mask to form the resin pattern (m1p).

A method of etching is not particularly limited, and common dry etching can be employed the same as in step (v). Examples of the etching gas used for etching the hard mask layer (m1) include oxygen gas, sulfur dioxide gas, halogen-based gas, and the like. For example, oxygen plasma etching using oxygen gas as the etching gas is preferred.

Step (vii)

Step (vii) is a step of processing the support 10 with the resist pattern (m1p) as a mask.

The support 10 can be processed by, for example, etching the processing layer 12 with the resin pattern (m1p) as a mask. A method of etching is not particularly limited, and common dry etching can be employed the same as in step (v). Examples of the etching gas used for etching the processing layer 12 include halogen-based gas.

In the method for manufacturing an electronic component according to the embodiment, the hard mask layer (m1) can be thickened (1 µm or more) since the hard mask layer (m1) is formed using the hard-mask forming composition according to the first aspect. Accordingly, the resin pattern formed from the hard mask layer (m1) can be suitably used as a mask for deep processing.

The method of manufacturing an electronic component by the three-layer resist method has been described above, the electronic component may be manufactured by the two-layer resist method. In that case, the resist film 30, instead of the hard mask layer (m2), is formed on the hard mask layer (m1).

The resist film 30 is exposed and developed to form the resist pattern 30p on the hard mask layer (m1) in the same manner as in step (iv).

The hard mask layer (m1) is etched with the resist pattern 30p as a mask to form the resin pattern (m1p) in the same manner as in step (vi).

The support 10 is processed with the resin pattern (m1p) as a mask to form the pattern 12p in the same manner as in step (vii).

Thus, the electronic component can also be manufactured by the two-layer resist method.

Therefore, the present invention also provides the method for manufacturing an electronic component, including steps of:

forming the hard mask layer (m1) on the support using the hard-mask forming composition according to the first aspect;

forming the resist film on the hard mask layer (m1);

forming the resist pattern on the hard mask layer (m1) by exposing and developing the resist film;

etching the hard mask layer (m1) with the resist pattern as a mask to form the resin pattern; and processing the support with the resin pattern as a mask.

Second Embodiment

The method for manufacturing an electronic component according to the third aspect includes steps of:

forming the hard mask layer (m1) on the support using the hard-mask forming composition according to the first aspect (hereinafter referred to as "step (i)");

forming the inorganic pattern made of the inorganic material on the hard mask layer (m1) (hereinafter referred to as "step (v)");

etching the hard mask layer (m1) with the inorganic pattern as a mask to form the resin pattern (hereinafter referred to as "step (vi)"); and processing the support with the resin pattern as a mask (hereinafter referred to as "step (vii)").

The method for manufacturing an electronic component according to the third aspect is the same as the method for manufacturing an electronic component according to the second aspect, except that the inorganic pattern made of the inorganic material is formed directly on the hard mask layer (m1) without forming the resist film.

A specific example of the method for manufacturing an electronic component according to an embodiment will be described below with reference to FIGS. 1, 2 and 6 to 8. However, the manufacturing method according to the embodiment is not limited thereto.

First, the hard mask layer (m1) is formed on the support 10 using the hard-mask forming composition according to the first aspect (FIGS. 1 and 2; step (i)'). This step is the same as step (i) in the method for manufacturing an electronic component according to the second aspect.

The inorganic pattern (m2p) made of the inorganic material is formed on the hard mask layer (m1) (FIG. 6; step (v)'). As the inorganic material for forming the inorganic pattern (m2p), for example, the same inorganic material provided as an exemplary example in step (ii) in the method for manufacturing an electronic component according to the second aspect, and a resist composition containing the inorganic material can be employed. A method for forming the inorganic pattern (m2p) is not particularly limited, and commonly known methods can be used. For example, the inorganic pattern (m2p) is formed on the hard mask layer (m1) by forming an inorganic resist film on the hard mask layer (m1) using a resist composition containing an inorganic material, and exposing and developing such a film.

The hard mask layer (m1) is etched with the inorganic pattern (m2p) as a mask to form the resin pattern (m1p) (FIG. 7; step (vi)'). This step is the same as step (vi) in the method for manufacturing an electronic component according to the second aspect.

The support 10 is processed with the resin pattern (m1p) as a mask to form the pattern 12p (FIG. 8; step (vii)'). This step is the same as step (vii) in the method for manufacturing an electronic component according to the second aspect.

The electronic component 100 provided with the pattern 12p on the substrate 11 can also be fabricated in this manner.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXAMPLES

Hereinafter, the present invention will be described in more detail referring to examples. However, the present invention is not limited to these examples.

Preparation Example of First Resin 10.00 g (34.09 mmol) of 9-naphthylcarbazole, 36.17 g (340.9 mmol) of benzaldehyde, and 66.96 g (306.8 mmol) of 1-pyrenol were dissolved in 75.42 g of propylene glycol monomethyl ether acetate (PGMEA). 87.53 g of 10% PGMEA solution of para-toluenesulfonic acid was added to the resultant mixture. Polymerization was carried out while maintaining the reaction temperature at about 120° C.

After reacting for about 10 hours, an excess amount of methanol/water (9:1) co-solvent was added to the reaction product, and the resultant solid was dissolved in an appropriate amount of PGMEA. The dissolved solid was added dropwise to an excess amount of ethanol/water (9:1) co-solvent, and the precipitate was collected. The precipitate was dried in a vacuum oven at about 65° C. for about 20 hours. Accordingly, the following resin (1-1) was obtained. A weight average molecular weight (Mw) of standard polystyrene conversion calculated by GPC measurement is 4000, and a molecular weight dispersion degree (Mw/Mn) is 2.1.

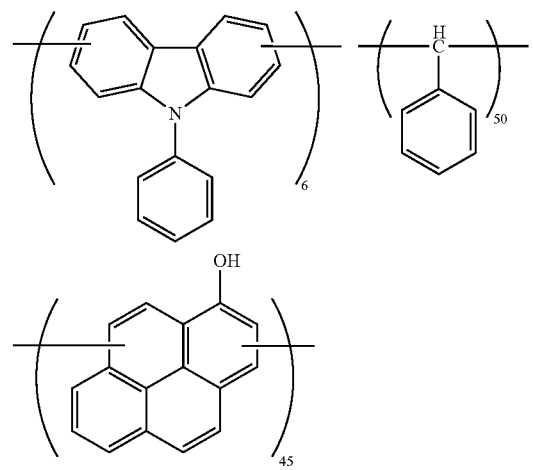

(1-1) Carbon Amount: 90.3% by Mass

Preparation Examples of Second Resin

Resin (2-1) and Resin (2-2)

The following resin (2-1) was obtained by additional condensation of m-cresol and p-cresol with formaldehyde under an acid catalyst according to a conventional method.

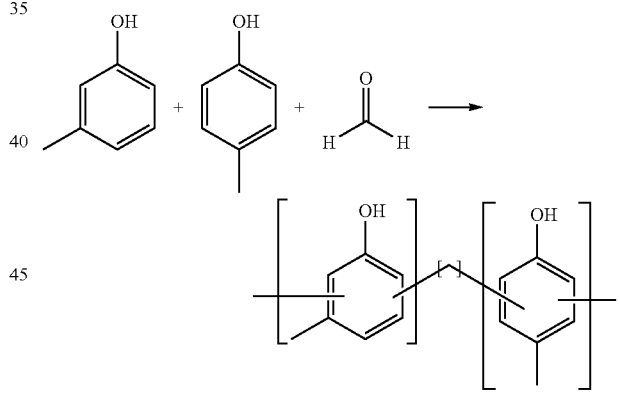

(2-1) Carbon Amount: 80.0% by Mass

The following resin (2-2) was obtained by additional condensation of m-cresol and 2,3,5-trimethylphenol with formaldehyde under the acid catalyst according to a conventional method.

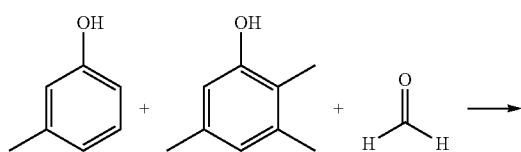

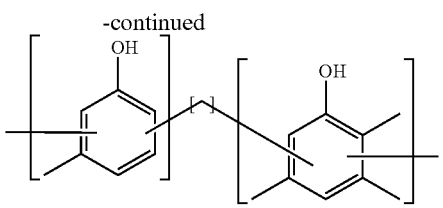

(2-2) Carbon Amount: 79.3% by Mass

Resin (2-3)

15.0 g (39.7 mmol) of 9,9-bis (4-hydroxy-3-methylphenyl) fluorene, 4.21 g (39.7 mmol) of benzaldehyde, 15.7 g of PGMEA, and 10.2 g of 10% PGMEA solution of p-toluenesulfonic acid were put in a 3-neck 100 mL flask equipped with a stirrer and a thermometer. Reaction was carried out at 120° C. for 10 hours. 45.7 g of PGMEA was added to the obtained solution. The solution was returned to room temperature and was added dropwise to an excess amount of a poor solvent (methanol:water=6:4), and the precipitate was filtered. The obtained precipitate was dried in a vacuum oven at about 60° C. overnight. Accordingly, 10.5 g of the following resin (2-3) was obtained. A weight average molecular weight (Mw) is 2100, and a polydispersity (Mw/Mn) is 1.58.

(2-3) Carbon Amount: 87.6% by Mass

Resin (2-4)

30.0 g (79.3 mmol) of 9,9-bis (4-hydroxy-3-methylphenyl) fluorene, 11.8 g (79.3 mmol) of 4-isopropyl benzaldehyde, 27.8 g of PGMEA, and 20.4 g of 10% PGMEA solution of p-toluenesulfonic acid were put in a 3-neck 200 mL flask equipped with a stirrer and a thermometer. Reaction was carried out at 120° C. for 16 hours. 51.3 g of PGMEA was added to the obtained solution. The solution was returned to room temperature and was added dropwise to an excess amount of a poor solvent (methanol:water=8:2), and the precipitate was filtered. The obtained precipitate was dried in a vacuum oven at about 60° C. overnight. Accordingly, 10.5 g of the following resin (2-4) was obtained. The weight average molecular weight (Mw) is 1900, and a polydispersity (Mw/Mn) is 1.32.

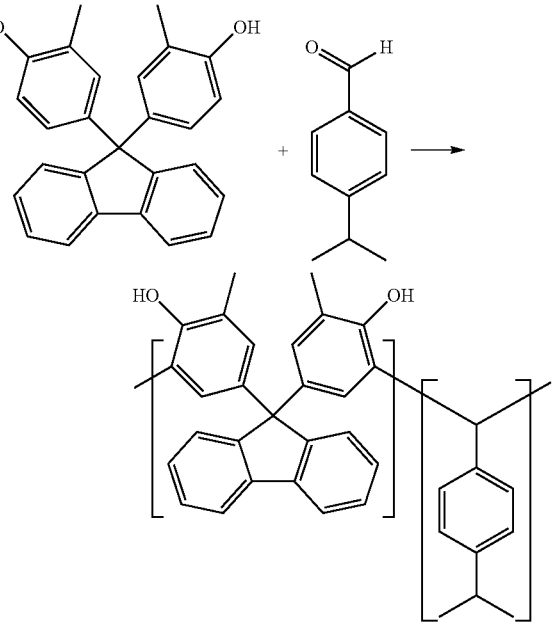

(2-4) Carbon Amount: 87.4% by Mass

Resin (2-5)

30.0 g (79.3 mmol) of 9,9-bis (4-hydroxy-3-methylphenyl) fluorene, 12.9 g (79.3 mmol) of 4-isopropyl benzaldehyde, 28.5 g of PGMEA, and 20.4 g of 10% PGMEA solution of p-toluenesulfonic acid were put in a 3-neck 200 mL flask equipped with a stirrer and a thermometer. Reaction was carried out at 120° C. for 14 hours. 51.3 g of PGMEA was added to the obtained solution. The solution was returned to room temperature and was added dropwise to an excess amount of a poor solvent (methanol:water=8:2), and the precipitate was filtered. The obtained precipitate was dried in a vacuum oven at about 60° C. overnight. Accordingly, 10.5 g of the following resin (2-5) was obtained. The weight average molecular weight (Mw) is 2000, and the polydispersity (Mw/Mn) is 1.29.

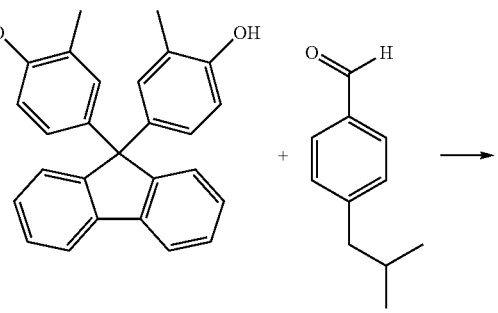

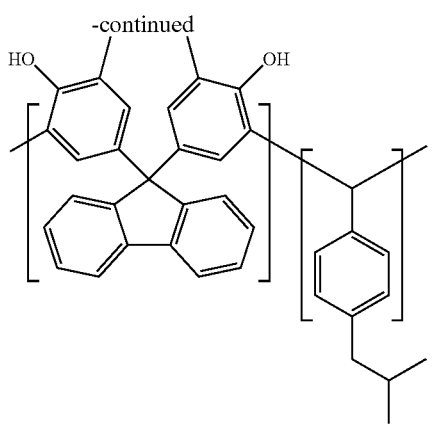

(2-5) Carbon Amount: 87.4% by Mass

Resin (2-6)

30.0 g (111.79 mmol) of Bisphenol Z (manufactured by Honshu Chemical Industry), 20.37 g (111.79 mmol) of 4-isopropyl benzaldehyde, 33.58 g of PGMEA, and 28.70 g of 10% PGMEA solution of p-toluenesulfonic acid were put in a 3-neck 100 mL flask equipped with a stirrer and a thermometer. Reaction was carried out at 120° C. for 5 hours. 58.1 g of PGMEA was added to the obtained solution. The solution was returned to room temperature and was added dropwise to an excess amount of a poor solvent (methanol:water=80:20), and the precipitate was filtered. The obtained precipitate was dried in a vacuum oven at about 60° C. overnight. Accordingly, 37 g of the following resin (2-6) was obtained. The weight average molecular weight (Mw) is 2700, and the polydispersity (Mw/Mn) is 2.32.

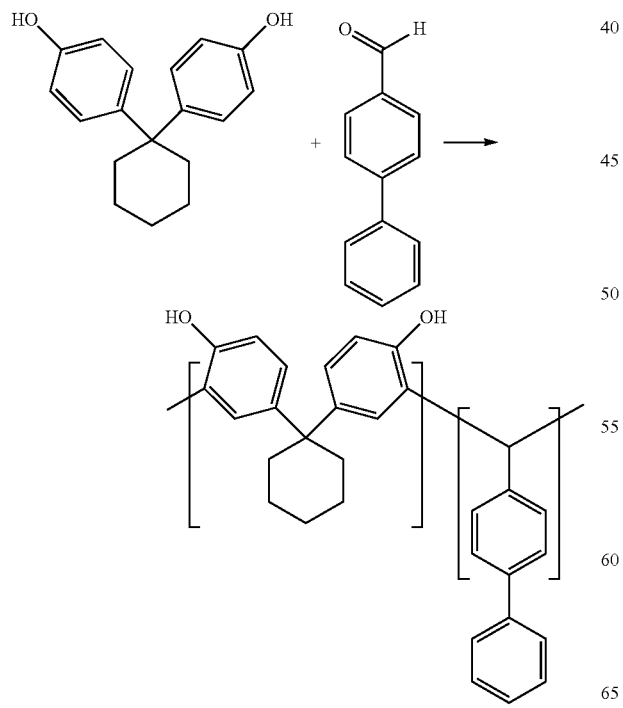

(2-6) Carbon Amount: 86.1% by Mass

Examples 1 to 6, and Comparative Examples 1 to 3

Preparation of Hard-Mask Forming Composition

Components listed in Table 1 were mixed and dissolved to prepare a hard-mask forming compositions of examples, respectively.

TABLE 1

|  | Resin Component | | Solvent |
|---|---|---|---|
| Example 1 | (1)-1 [70] | (2)-1 [30] | (S)-1 [280] |
| Example 2 | (1)-1 [70] | (2)-2 [30] | (S)-1 [280] |
| Example 3 | (1)-1 [70] | (2)-3 [30] | (S)-1 [250] |
| Example 4 | (1)-1 [70] | (2)-4 [30] | (S)-1 [250] |
| Example 5 | (1)-1 [70] | (2)-5 [30] | (S)-1 [250] |
| Example 6 | (1)-1 [70] | (2)-6 [30] | (S)-1 [250] |
| Comparative Example 1 | (1)-1 [100] | — | (S)-1 [280] |
| Comparative Example 2 | (1)-1 [70] | (3)-1 [30] | (S)-1 [280] |
| Comparative Example 3 | (1)-1 [70] | (3)-2 [30] | (S)-1 [280] |

Each abbreviation in Table 1 is defined as follows. The numerical values in square brackets are a blending amount (parts by mass). The following resins (3-1) and (3-2) were synthesized by radical polymerization of a monomer from which each structural unit is derived according to a conventional method.

(1)-1: Resin (1-1)
(2)-1: Resin (2-1)
(2)-2: Resin (2-2)
(2)-3: Resin (2-3)
(2)-4: Resin (2-4)
(2)-5: Resin (2-5)
(2)-6: Resin (2-6)
(3)-1: Resin (3-1)
(3)-2: Resin (3-2)
(S-1): Mixed solvent of PGMEA/cyclohexanone=75/25 (mixing ratio).

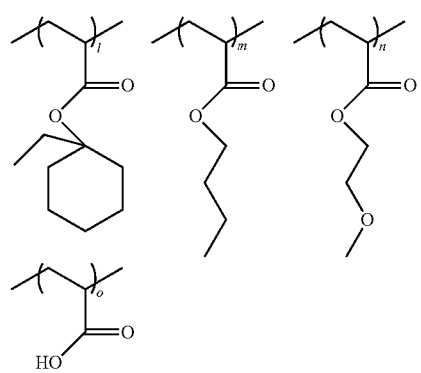

l/m/n/o = 42.4/11.8/35.4/10.4

(3-1) Carbon amount: 65.5% by mass

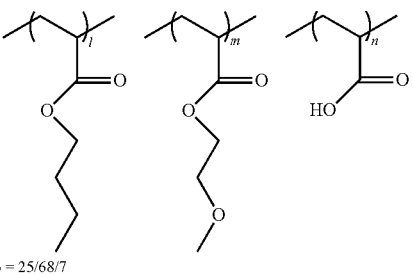

l/m/n/o = 25/68/7

(3-2) Carbon amount: 58.0% by mass

Evaluation of Crack

The hard-mask forming compositions of Examples 1 to 6 and Comparative Examples 1 to 3 are respectively coated on a silicon wafer using a spinner, and dried by baking for 60 seconds at a temperature of 350° C. A hard mask layer of 2 to 4 μm thickness was formed.

The hard mask layer was observed with the opto-digital microscope DSX500, and occurrence of cracks was evaluated according to the following evaluation criteria. The results are summarized in Table 2.

Evaluation Criteria
0: No crack occurs
1: Several cracks on the wafer
2: Several tens of cracks on the entire surface of the wafer
3: Several hundreds of cracks on the entire surface of the wafer
4: Large number of cracks on the entire surface of the wafer; the hard mask layer is very fragile Evaluation of Shrinkage Rate The hard-mask forming compositions of Examples 1 to 6 and Comparative Examples 1 to 3 are respectively coated on a silicon wafer using a spinner, and dried by baking for 60 seconds at a temperature of 240° C. or 350° C. A hard mask layer of 2 to 4 μm thickness was formed.

The thickness of the hard mask layer in each of the samples baked at 240° C. and the samples baked at 350° C. was measured, and a shrinkage rate was calculated by the following equation. The results are summarized in Table 2.

Shrinkage rate (%)=[(thickness of hard mask layer baked at 350° C.)/(thickness of hard mask layer baked at 240° C.)]×100

TABLE 2

|  | Cracks | Shrinkage Rate (%) |
| --- | --- | --- |
| Example 1 | 0 | 96.8 |
| Example 2 | 0 | 98.4 |
| Example 3 | 0 | 98.2 |
| Example 4 | 0 | 98.3 |
| Example 5 | 0 | 99.2 |
| Example 6 | 0 | 92.6 |
| Comparative Example 1 | 3 | 98.8 |
| Comparative Example 2 | 0 | 85.3 |
| Comparative Example 3 | 0 | 89.8 |

As shown in Table 2, cracks hardly occurred and deterioration of the shrinkage rate was not observed in the hard-mask forming compositions of Examples 1 to 6. On the other hand, lots of cracks were observed on the entire surface of the wafer in Comparative Example 1. In Comparative Examples 2 and 3, the shrinkage rate was deteriorated even though cracks were hardly recognized.

Examples 7 to 11, and Comparative Example 4

Preparation of Hard-Mask Forming Composition

Components listed in Table 3 were mixed and dissolved to prepare a hard-mask forming compositions of examples, respectively.

TABLE 3

|  | Resin Component | | Solvent |
| --- | --- | --- | --- |
| Example 7 | (1)-1 [90] | (2)-1 [10] | (S)-1 [280] |
| Example 8 | (1)-1 [90] | (2)-2 [10] | (S)-1 [280] |
| Example 9 | (1)-1 [90] | (2)-3 [10] | (S)-1 [270] |
| Example 10 | (1)-1 [90] | (2)-4 [10] | (S)-1 [270] |
| Example 11 | (1)-1 [90] | (2)-5 [10] | (S)-1 [270] |
| Comparative Example 4 | (1)-1 [100] | — | (S)-1 [280] |

Each abbreviation in Table 3 is the same as that of Table 1, respectively.

Evaluation of Crack

Cracks were evaluated in the same manner as described above except that each of the hard-mask forming compositions of each example in Table 3 was used. The results are summarized in Table 4.

Evaluation Criteria
0: No crack occurs
1: Several cracks on the wafer
2: Several tens of cracks on the entire surface of the wafer
3: Several hundreds of cracks on the entire surface of the wafer
4: Large number of cracks on the entire surface of the wafer; the hard mask layer is very fragile

TABLE 4

|  | Cracks |
| --- | --- |
| Example 7 | 1.0 |
| Example 8 | 0.5 |
| Example 9 | 1.0 |
| Example 10 | 1.0 |
| Example 11 | 1.0 |
| Comparative Example 4 | 3.0 |

As shown in Table 4, occurrence of cracks in the hard-mask forming compositions of Examples 7 to 11 was suppressed as compared with Comparative Example 4.

EXPLANATION OF REFERENCES

10: support
11: substrate
12: processing layer
12*p* pattern

20: BARC layer
30: resist film
30*p*: resist pattern
m1, m2: hard mask layer
m1*p*: resist pattern
m2*p*: inorganic pattern
100: electronic component

What is claimed is:

1. A hard-mask forming composition, which is used for forming a hard mask used in lithography, comprising:
   a first resin; and
   a second resin,
   wherein an amount of carbon contained in the first resin is 85% by mass or more with respect to the total mass of all elements constituting the first resin,
   an amount of carbon contained in the second resin is 70% by mass or more with respect to the total mass of all elements constituting the second resin and less than the amount of carbon contained in the first resin, and
   the first resin contains a resin having a structural unit (u11) represented by the following general formula (u11-1) and a structural unit (u12) represented by the following general formula (u12-1):

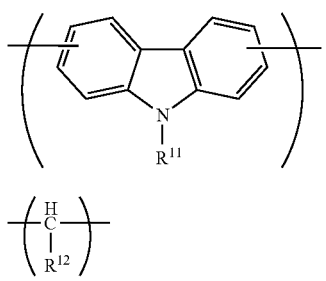

(u11-1)

(u12-1)

wherein $R^{11}$ is a hydrocarbon group having 1 to 20 carbon atoms which may have a substituent, or a hydrogen atom, and $R^{12}$ is an aromatic hydrocarbon group having 6 to 30 carbon atoms which may have a substituent.

2. The hard-mask forming composition according to claim 1, wherein the resin further has a structural unit (u13) represented by the following general formula (u13-1):

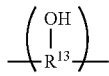

(u13-1)

wherein $R^{13}$ is a polycyclic hydrocarbon group of 10 to 30 carbon atoms which may have a substituent.

3. The hard-mask forming composition according to claim 1, wherein the second resin contains a phenol resin having a structural unit (u21) represented by the following general formula (u21-1) and a structural unit (u22) represented by the following general formula (u22-1):

(u21-1)

(u22-1)

wherein $R^{21}$ is an organic group derived from a phenol compound having at least one hydroxy group, and $R^{22}$ is an aromatic hydrocarbon group having 6 to 30 carbon atoms which may have a substituent, or a hydrogen atom.

4. The hard-mask forming composition according to claim 1, wherein a mass ratio of the first resin to the second resin is 50/50 to 95/5.

5. A method for manufacturing an electronic component, comprising:
   forming a hard mask layer (m1) on a support using the hard-mask forming composition according to claim 1;
   forming a hard mask layer (m2) made of an inorganic material on the hard mask layer (m1);
   forming a resist film on the hard mask layer (m2);
   forming a resist pattern on the hard mask layer (m2) by exposing and developing the resist film;
   etching the hard mask layer (m2) with the resist pattern as a mask to form an inorganic pattern;
   etching the hard mask layer (m1) with the inorganic pattern as a mask to form a resin pattern; and
   processing the support with the resin pattern as a mask.

6. A method for manufacturing an electronic component, comprising:
   forming a hard mask layer (m1) on a support using the hard-mask forming composition according to claim 1;
   forming an inorganic pattern made of an inorganic material on the hard mask layer (m1);
   etching the hard mask layer (m1) with the inorganic pattern as a mask to form a resin pattern; and
   processing the support with the resin pattern as a mask.

* * * * *